(12) United States Patent
Toya et al.

(10) Patent No.: US 10,985,286 B2
(45) Date of Patent: *Apr. 20, 2021

(54) POWER GENERATION MODULE AND WIRING SUBSTRATE

(71) Applicant: Sumitomo Electric Industries, Ltd., Osaka (JP)

(72) Inventors: Kazumasa Toya, Osaka (JP); Takashi Iwasaki, Osaka (JP); Youichi Nagai, Osaka (JP); Koji Mori, Osaka (JP); Kenji Saito, Osaka (JP); Rui Mikami, Osaka (JP); Takeshi Yamana, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 199 days.

This patent is subject to a terminal disclaimer.

(21) Appl. No.: 15/325,045

(22) PCT Filed: Jul. 6, 2015

(86) PCT No.: PCT/JP2015/069409
§ 371 (c)(1),
(2) Date: Jan. 9, 2017

(87) PCT Pub. No.: WO2016/006571
PCT Pub. Date: Jan. 14, 2016

(65) Prior Publication Data
US 2017/0213923 A1    Jul. 27, 2017

(30) Foreign Application Priority Data
Jul. 10, 2014    (JP) .............................. JP2014-142327

(51) Int. Cl.
H01L 31/0392    (2006.01)
H05K 1/02    (2006.01)
(Continued)

(52) U.S. Cl.
CPC .. *H01L 31/03926* (2013.01); *H01L 31/02013* (2013.01); *H01L 31/0508* (2013.01);
(Continued)

(58) Field of Classification Search
CPC .................................................. H01L 31/03926
See application file for complete search history.

(56) References Cited

U.S. PATENT DOCUMENTS

| 2005/0045855 | A1 | 3/2005 | Tonapi et al. |
| 2006/0244177 | A1 | 11/2006 | Kaneto et al. |

(Continued)

FOREIGN PATENT DOCUMENTS

| CN | 1856213 A | 11/2006 |
| JP | 2005-051133 A | 2/2005 |

(Continued)

OTHER PUBLICATIONS

Office Action dated Jun. 10, 2019 issued for the co-pending U.S. Appl. No. 15/325,034.

(Continued)

*Primary Examiner* — Niki Bakhtiari
(74) *Attorney, Agent, or Firm* — Baker Botts L.L.P.; Michael A. Sartori

(57) ABSTRACT

This power generation module includes: a power generating portion (30) including a power generating element (19); and a wiring substrate. The wiring substrate includes: a reinforcement plate; and a flexible printed circuit (79) provided above the reinforcement plate. The flexible printed circuit (79) has: an FPC land portion (70) configured to have the power generating portion (30) mounted thereto; and a FPC wire portion (73) connected to the FPC land portion (70). The width of the FPC wire portion (73) is smaller than the width of the FPC land portion (70).

16 Claims, 24 Drawing Sheets

(51) Int. Cl.

| | | |
|---|---|---|
| *H05K 1/18* | (2006.01) | |
| *H01L 31/05* | (2014.01) | |
| *H02S 40/22* | (2014.01) | |
| *H02S 20/32* | (2014.01) | |
| *H02S 30/10* | (2014.01) | |
| *H01L 31/02* | (2006.01) | |
| *H01L 31/054* | (2014.01) | |
| *H02S 40/42* | (2014.01) | |

(52) U.S. Cl.
CPC ......... *H01L 31/0543* (2014.12); *H02S 20/32* (2014.12); *H02S 30/10* (2014.12); *H02S 40/22* (2014.12); *H02S 40/42* (2014.12); *H05K 1/028* (2013.01); *H05K 1/189* (2013.01); *H05K 2201/046* (2013.01); *H05K 2201/09263* (2013.01); *H05K 2201/10121* (2013.01); *Y02E 10/52* (2013.01)

(56) References Cited

U.S. PATENT DOCUMENTS

| | | |
|---|---|---|
| 2011/0132435 A1 | 6/2011 | Nakata |
| 2011/0155217 A1 | 6/2011 | Yang et al. |
| 2012/0186860 A1 | 7/2012 | Takaoka |
| 2012/0279551 A1 | 11/2012 | Garboushian et al. |
| 2012/0285530 A1 * | 11/2012 | Ziegler ................ H01L 31/052 136/256 |
| 2014/0230883 A1 | 8/2014 | Iwasaki et al. |

FOREIGN PATENT DOCUMENTS

| | | | | |
|---|---|---|---|---|
| JP | 2007-019334 A | 1/2007 | | |
| JP | 2011-210705 A | 10/2011 | | |
| JP | 2011-210747 A | 10/2011 | | |
| JP | 2013-080760 A | 5/2013 | | |
| JP | 2013-084855 A | 5/2013 | | |
| JP | 2013-153076 A | 8/2013 | | |
| JP | 2014-035502 A | 2/2014 | | |
| TW | 201324817 A | 6/2013 | | |
| WO | WO-2011104016 A1 * | 9/2011 | ........... | H01L 31/044 |
| WO | 2013054709 A1 | 4/2013 | | |
| WO | WO-2013054709 A1 * | 4/2013 | ......... | H01L 31/0543 |

OTHER PUBLICATIONS

Notice of Allowance dated Jun. 13, 2019 for the co-pending U.S. Appl. No. 15/325,006.
Notice of Allowance issued in U.S. Appl. No. 14/795,653, dated Dec. 8, 2017 [Related Application; Provided in IFW].
Office Action issued in co-pending U.S. Appl. No. 14/795,653 dated Aug. 3, 2017. [Provided in IFW].
Office Action in co-pending U.S. Appl. No. 14/795,653, dated Feb. 7, 2017.
Office Action issued in co-pending U.S. Appl. No. 15/325,006 dated Jan. 24, 2019 [Related Application; provided in IFW].
International Search Report in International Application No. PCT/JP2015/069404, dated Aug. 11, 2015.
International Search Report in International Application No. PCT/JP2015/069407, dated Aug. 11, 2015.
International Search Report in counterpart International Application No. PCT/JP2015/069409, dated Aug. 11, 2015.
International Search Report in International Application No. PCT/JP2015/069411, dated Sep. 8, 2015.
Office Action dated May 1, 2019 issued for the co-pending U.S. Appl. No. 15/324,984 [Provided in IFW].
Office Action (Restriction Requirement) issued in co-pending U.S. Appl. No. 15/324,984 dated Feb. 15, 2019 [Related Application; provided in IFW].
Notice of Allowance issued in U.S. Appl. No. 15/325,006, dated Oct. 8, 2019.
Advisory Action issued in U.S. Appl. No. 15/324,984, dated Oct. 23, 2019.
Final Office Action issued in U.S. Appl. No. 15/325,034, dated Oct. 22, 2019.
Corrected Notice of Allowability in U.S. Appl. No. 15/325,006, dated Jun. 27, 2019.
Final Office Action in U.S. Appl. No. 15/324,984, dated Aug. 13, 2019.
Notice of Allowance issued in U.S. Appl. No. 15/325,006, dated Jan. 10, 2020.
Advisory Action issued in U.S. Appl. No. 15/325,034, dated Jan. 30, 2020.
Office Action in U.S. Appl. No. 15/324,984, dated Jun. 17, 2020.
Office Action issued in U.S. Appl. No. 15/325,034 dated Nov. 13, 2020.
Final Office Action in U.S. Appl. No. 15/324,984, dated Oct. 14, 2020.
English translation of Takagi, JP 2001-298217.
Advisory Action issued in U.S. Appl. No. 15/324,984, dated Feb. 8, 2021.

* cited by examiner

POWER GENERATION MODULE AND WIRING SUBSTRATE

TECHNICAL FIELD

The present invention relates to power generation modules and wiring substrates, and in particular, relates to a power generation module including a flexible printed circuit and a wiring substrate.

BACKGROUND ART

There have been developed concentrator photovoltaic apparatuses in which sunlight is converged onto solar cell elements by use of lenses and the like to increase the power generating efficiency of the solar cell elements.

As one example of a concentrator photovoltaic apparatus, Japanese Laid-Open Patent Publication No. 2013-84855 (PATENT LITERATURE 1) discloses a technology as below. That is, a concentrator solar cell module includes: a plurality of solar cell elements; an elongated receiver substrate having the solar cell elements arranged thereon in a single line at constant intervals; and a module substrate having a plurality of the receiver substrates arranged thereon in parallel at constant intervals. In the concentrator solar cell module, each receiver substrate includes: an elongated receiver base; and a plurality of wiring members arranged on the receiver base in a single line along the longitudinal direction, with their adjacent ends facing each other. A positive electrode pad portion is provided on one end of each wiring member, and a negative electrode pad portion is provided on the other end thereof. The positive electrode terminal of each solar cell element is connected to the positive electrode pad portion and the negative electrode terminal of the solar cell element is connected to the negative electrode pad portion, whereby a solar cell element mounting portion is formed.

CITATION LIST

Patent Literature

PATENT LITERATURE 1: Japanese Laid-Open Patent Publication No. 2013-84855

SUMMARY OF INVENTION

Technical Problem

For example, in the concentrator solar cell module described in PATENT LITERATURE 1, when sunlight is converged onto a solar cell element by a lens, the temperature of the solar cell element becomes high. Heat of the solar cell element is transferred to the receiver substrate to which the solar cell element is mounted, and thus, the receiver substrate expands due to heat in some cases.

For example, in a configuration in which the receiver substrate is adhered to a member, the receiver substrate is detached from the member due to influence of dew condensation or the like in some cases.

Then, if the position of the solar cell element is shifted from the focal point of the lens as a result of deformation due to thermal expansion of the receiver substrate or detachment of the receiver substrate due to dew condensation or the like, the power generating efficiency of the solar cell element is decreased in some cases.

The present invention has been made in order to solve the above problem. An object of the present invention is to provide a power generation module and a wiring substrate that can suppress decrease in the power generating efficiency due to influence of heat, influence of dew condensation, or the like.

Solution to Problem (1) A power generation module according to an aspect of the present invention includes: a power generating portion including a power generating element; and a wiring substrate, wherein the wiring substrate includes: a reinforcement plate; and a flexible printed circuit provided above the reinforcement plate, the flexible printed circuit has: an FPC land portion configured to have the power generating portion mounted thereto; and an FPC wire portion connected to the FPC land portion, and a width of the FPC wire portion is smaller than a width of the FPC land portion.

(16) A wiring substrate according to an aspect of the present invention is configured to have a power generating portion mounted thereto, the wiring substrate including a land portion and a wire portion, wherein the land portion has a shape that allows the power generating portion to be mounted to the land portion, a width of the wire portion is smaller than a width of the land portion, each of the land portion and the wire portion includes: a reinforcement plate formed of metal; and a flexible printed circuit provided above the reinforcement plate, the land portion has a first region and a second region, the first region has a first width, the second region is positioned at at least one end in a length direction of the land portion, the second region being connected to the first region, the second region having a second width, the first width is greater than the second width, and an angle between an edge of the first region and an edge of the second region is greater than 90 degrees and not greater than 170 degrees, the edge of the first region being positioned at an end of the first region in a width direction of the land portion, the edge of the second region being positioned at an end of the second region in the width direction, the edge of the second region being connected to the edge of the first region.

(17) A wiring substrate according to another aspect of the present invention is configured to have a power generating portion mounted thereto, the wiring substrate including a land portion and a wire portion, wherein the land portion has a shape that allows the power generating portion to be mounted to the land portion, a width of the wire portion is smaller than a width of the land portion, each of the land portion and the wire portion includes: a reinforcement plate formed of metal; and a flexible printed circuit provided above the reinforcement plate, the land portion has a first region and a second region, the first region has a first width, the second region is positioned at at least one end in a length direction of the land portion, the second region being connected to the first region, the second region having a second width, the first width is greater than the second width, and a connection portion between an edge of the first region and an edge of the second region is a curve, the edge of the first region being positioned at an end of the first region in a width direction of the land portion, the edge of the second region being positioned at an end of the second region in the width direction, the edge of the second region being connected to the edge of the first region.

Advantageous Effects of Invention

According to the present invention, it is possible to suppress decrease in the power generating efficiency due to influence of heat, influence of dew condensation, or the like.

DESCRIPTION OF EMBODIMENTS

Figure 1:
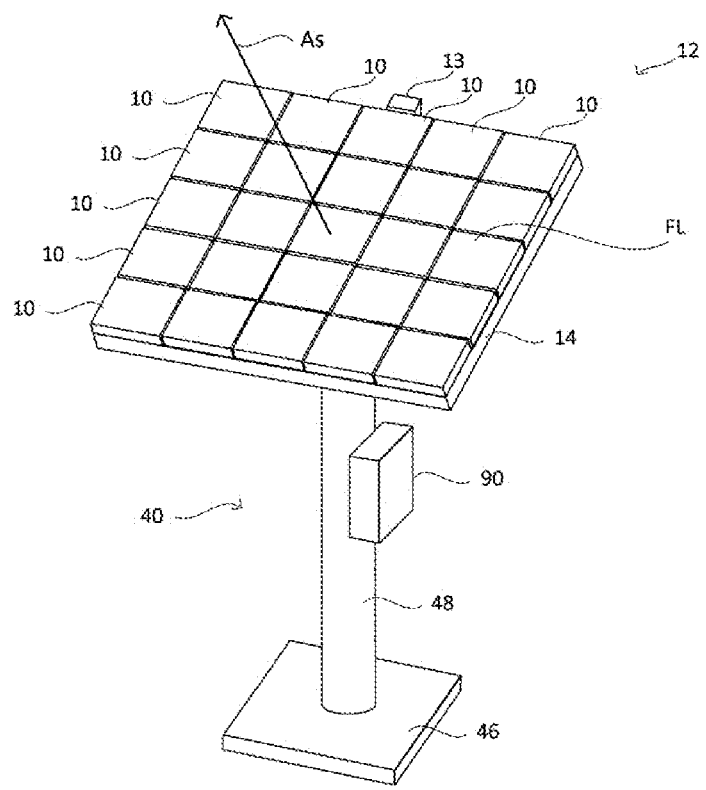
FIG. 1 is a perspective view of a photovoltaic apparatus according to a first embodiment of the present invention.

First, contents of embodiments of the present invention will be listed for description.

(1) A power generation module according to an embodiment of the present invention includes: a power generating portion including a power generating element; and a wiring substrate, wherein the wiring substrate includes: a reinforcement plate; and a flexible printed circuit provided above the reinforcement plate, the flexible printed circuit has: an FPC land portion configured to have the power generating portion mounted thereto; and an FPC wire portion connected to the FPC land portion, and a width of the FPC wire portion is smaller than a width of the FPC land portion.

With this configuration, the wiring substrate having a certain degree of flexibility can be further provided with a feature that the FPC wire portion more easily bends than the FPC land portion. Accordingly, for example, even in a case where compressive stress in the extending direction is applied to the wiring substrate as a result of thermal expansion of the wiring substrate, the FPC wire portion bends so as to absorb the expansion in the extending direction, whereby deformation and positional shift of the FPC land portion can be prevented. Accordingly, for example, in a case where a lens having its focal point set at the power generating portion is provided above the power generating portion mounted to the FPC land portion, the position of the power generating portion can be prevented from being shifted from the focal point of the lens. Therefore, decrease in the power generating efficiency due to influence of heat can be suppressed.

(2) Preferably, the FPC land portion has a length along an extending direction of the wiring substrate, the FPC wire portion has a length along the extending direction of the wiring substrate, and the length of the FPC wire portion is greater than the length of the FPC land portion.

This configuration allows the FPC wire portion to more easily bend than the FPC land portion. Thus, the position of the power generating portion can be more reliably prevented from being shifted from the focal point of the lens.

(3) More preferably, the length of the FPC wire portion is greater than 100% and not greater than 600% of the length of the FPC land portion.

With this configuration, it is possible to make the land portion less likely to bend than the wire portion, while causing the land portion to have a size that allows the power generating portion to be mounted thereto.

(4) Preferably, the width of the FPC wire portion is not less than 0.1% and not greater than 50% of the width of the FPC land portion.

With this configuration, for example, the width of the wire portion can be reduced relative to the width of the land portion. Thus, it is possible to provide the wire portion with a feature that the wire portion more easily bends than the land portion. In addition, the width of the wire portion can be increased to an extent that the strength of the wire portion does not pose a problem.

(5) Preferably, the FPC land portion has a first region and a second region, the first region has a first width, the second region is positioned at at least one end in a length direction of the FPC land portion, the second region being connected to the first region, the second region having a second width, and the second width is smaller than the first width and is greater than the width of the FPC wire portion.

With this configuration, for example, heat transferred from the power generating portion to the first region can be efficiently dissipated via the second region to the wire portion.

(6) Preferably, the FPC land portion has a first region and a second region, the first region has a first width, the second region is positioned at each of both ends in a length direction of the FPC land portion, the second region being connected to the first region, the second region having a second width, and the second width is smaller than the first width and is greater than the width of the FPC wire portion.

With this configuration, heat in the first region can be dissipated to both of the wire portions connected to the respective second regions.

(7) More preferably, the second width becomes smaller from the first region toward the FPC wire portion.

With this configuration, heat in the second region can be efficiently dissipated to the wire portion.

(8) More preferably, the second region has a length along an extending direction of the wiring substrate, and relationship between the second width and the length of the second region satisfies a formula below, $$0<(Lf12/Wf2)\leq 10$$

where $Wf2$ is the second width and $Lf12$ is the length of the second region.

With this configuration, heat in the second region can be more efficiently dissipated to the wire portion.

(9) More preferably, in a plan view from above the wiring substrate, the power generating portion is disposed such that a center portion of the power generating portion is included in the first region.

With this configuration, the power generating portion can be disposed at a position separated to some extent from the wire portion. Thus, positional shift of the power generating portion due to influence of bending of the wire portion can be more reliably prevented.

(10) Preferably, an area of the FPC land portion is not less than 20% and not greater than 1000% of an area of the FPC wire portion.

With this configuration, it is possible to make the land portion less likely to bend than the wire portion, while causing the land portion to have a size that allows the power generating portion to be mounted thereto.

(11) Preferably, the reinforcement plate has: a land reinforcement portion fixed to the FPC land portion; and a wire reinforcement portion fixed to the FPC wire portion, and a width of the wire reinforcement portion is smaller than a width of the land reinforcement portion.

This configuration allows the wire portion to more easily bend than the land portion.

(12) More preferably, the reinforcement plate is adhered to a base portion by an adhesive layer, the adhesive layer has: a land adhesion region configured to adhere the land reinforcement portion to the base portion; and a wire adhesion region configured to adhere the wire reinforcement portion to the base portion, and a width of the wire adhesion region is smaller than a width of the land adhesion region.

With this configuration, in a state where the wiring substrate is adhered to the base portion, the wire reinforcement portion is allowed to be more easily detached from the base portion, than the land reinforcement portion. Accordingly, for example, even when compressive stress in the extending direction is applied to the wiring substrate as a result of thermal expansion of the wiring substrate, the wire reinforcement portion and the wire portion which are in a state of being fixed to each other bend while being detached from the base portion so as to absorb the expansion in the extending direction. Accordingly, deformation and positional shift of the land portion can be prevented.

(13) Preferably, the FPC land portion has a first region and a second region, the first region has a first width, the second region is positioned at at least one end in a length direction of the FPC land portion, the second region being connected to the first region, the second region having a second width, the first width is greater than the second width, and an angle between an edge of the first region and an edge of the second region is greater than 90 degrees and not greater than 170 degrees, the edge of the first region being positioned at an end of the first region in a width direction of the FPC land portion, the edge of the second region being positioned at an end of the second region in the width direction, the edge of the second region being connected to the edge of the first region.

Thus, with the configuration in which the angle in the land portion is set to be an obtuse angle, for example, in a case where the flexible printed circuit and the reinforcement plate in the wiring substrate are adhered to each other, it is possible to suppress detachment between the flexible printed circuit and the reinforcement plate at a corner of the land portion due to influence of dew condensation or the like.

(14) Preferably, the FPC land portion has a first region and a second region, the first region has a first width, the second region is positioned at at least one end in a length direction of the FPC land portion, the second region being connected to the first region, the second region having a second width, the first width is greater than the second width, and a connection portion between an edge of the first region and an edge of the second region forms a curve, the edge of the first region being positioned at an end of the first region in a width direction of the FPC land portion, the edge of the second region being positioned at an end of the second region in the width direction, the edge of the second region being connected to the edge of the first region.

Thus, with the configuration in which roundness is provided to the land portion to reduce corners, it is possible to more reliably prevent detachment between the flexible printed circuit and the reinforcement plate due to influence of dew condensation or the like.

(15) More preferably, the connection portion between the edge of the first region and the edge of the second region forms a continuous curve.

This configuration can make smoother the periphery of the land portion. Thus, it is possible to more reliably prevent detachment between the flexible printed circuit and the reinforcement plate due to influence of dew condensation or the like.

(16) A wiring substrate according to an embodiment of the present invention is configured to have a power generating portion mounted thereto, the wiring substrate including a land portion and a wire portion, wherein the land portion has a shape that allows the power generating portion to be mounted to the land portion, a width of the wire portion is smaller than a width of the land portion, each of the land portion and the wire portion includes: a reinforcement plate formed of metal; and a flexible printed circuit provided above the reinforcement plate, the land portion has a first region and a second region, the first region has a first width, the second region is positioned at at least one end in a length direction of the land portion, the second region being connected to the first region, the second region having a second width, the first width is greater than the second width, and an angle between an edge of the first region and an edge of the second region is greater than 90 degrees and not greater than 170 degrees, the edge of the first region being positioned at an end of the first region in a width direction of the land portion, the edge of the second region being positioned at an end of the second region in the width direction, the edge of the second region being connected to the edge of the first region.

Thus, with the configuration in which the angle in the land portion is set to be an obtuse angle, for example, in a case where the flexible printed circuit and the reinforcement plate in the wiring substrate are adhered to each other, it is possible to suppress detachment between the flexible printed circuit and the reinforcement plate at a corner of the land portion due to influence of dew condensation or the like. In addition, in a case where the wiring substrate and the base portion at which the wiring substrate is placed are adhered to each other, it is possible to suppress detachment of the land portion from the base portion due to influence of dew condensation or the like. Therefore, it is possible to suppress decrease in the power generating efficiency due to influence of dew condensation or the like.

(17) A wiring substrate according to an embodiment of the present invention is configured to have a power generating portion mounted thereto, the wiring substrate including a land portion and a wire portion, wherein the land portion has a shape that allows the power generating portion to be mounted to the land portion, a width of the wire portion is smaller than a width of the land portion, each of the land portion and the wire portion includes: a reinforcement plate formed of metal; and a flexible printed circuit provided above the reinforcement plate, the land portion has a first region and a second region, the first region has a first width, the second region is positioned at at least one end in a length direction of the land portion, the second region being connected to the first region, the second region having a second width, the first width is greater than the second width, and a connection portion between an edge of the first region and an edge of the second region is a curve, the edge of the first region being positioned at an end of the first region in a width direction of the land portion, the edge of the second region being positioned at an end of the second region in the width direction, the edge of the second region being connected to the edge of the first region.

Thus, with the configuration in which roundness is provided to the land portion to reduce corners, for example, in a case where the flexible printed circuit and the reinforcement plate are adhered to each other in the wiring substrate, it is possible to suppress detachment between the flexible printed circuit and the reinforcement plate due to influence of dew condensation or the like. In addition, in a case where the wiring substrate and the base portion at which the wiring substrate is placed are adhered to each other, it is possible to suppress detachment of the land portion from the base portion due to influence of dew condensation or the like. Therefore, it is possible to suppress decrease in the power generating efficiency due to influence of dew condensation or the like.

(18) Preferably, the connection portion between the edge of the first region and the edge of the second region forms a continuous curve.

This configuration can make further smoother the periphery of the land portion. Thus, it is possible to more reliably prevent detachment between the flexible printed circuit and the reinforcement plate due to influence of dew condensation or the like. In addition, it is possible to more reliably prevent detachment of the land portion from the base portion due to influence of dew condensation or the like.

Hereinafter, embodiments of the present invention will be described with reference to the drawings. It should be noted that the same or corresponding parts are denoted by the same reference signs, and description thereof is not repeated. At least some parts of the embodiments descried below can be combined together as desired.

First Embodiment

FIG. 1 is a perspective view of a photovoltaic apparatus according to a first embodiment of the present invention.

With reference to FIG. 1, a photovoltaic apparatus 101 includes a photovoltaic panel 12 and a pedestal 40. The photovoltaic panel 12 includes a plurality of photovoltaic modules 10, a sun direction sensor 13, and a frame part 14. The pedestal 40 includes a base 46, a post 48, a function part 90, and a position changeable part not shown. The photovoltaic apparatus 101 is a concentrator photovoltaic apparatus, for example.

The photovoltaic panel 12 includes 5 rows×5 columns of the photovoltaic modules 10, i.e., 25 photovoltaic modules 10, for example. The photovoltaic modules 10 are mounted side by side on top of the frame part 14.

Each photovoltaic module 10 receives sunlight to generate power, and outputs, by using wiring not shown, direct-current power which is the generated power, to the function part 90 mounted to a side face of the post 48.

The post 48 is set, for example, on the base 46 provided on the ground, so as to be perpendicular to the ground.

The position changeable part not shown includes a motor. On the basis of a control signal from the function part 90, the position changeable part operates so as to direct toward the sun the direction of a light receiving surface FL of the photovoltaic panel 12, i.e., the direction of the normal line of the light receiving surface FL indicated by an arrow As. Accordingly, the orientation of the light receiving surface FL of the photovoltaic panel 12 changes so as to track the sun from sunrise till sunset.

The sun direction sensor 13 is used for detecting the direction of the sun, and outputs a sensor signal indicating the detection result, to the function part 90.

For example, the function part 90 includes a housing and various types of units accommodated in the housing. Specifically, for example, the housing accommodates: a junction box which connects wires from the respective photovoltaic modules 10; a power conditioner which converts direct-current power outputted from the photovoltaic modules 10, into alternating-current power; a control unit for controlling the orientation of the light receiving surface FL of the photovoltaic panel 12; and the like.

Figure 2:
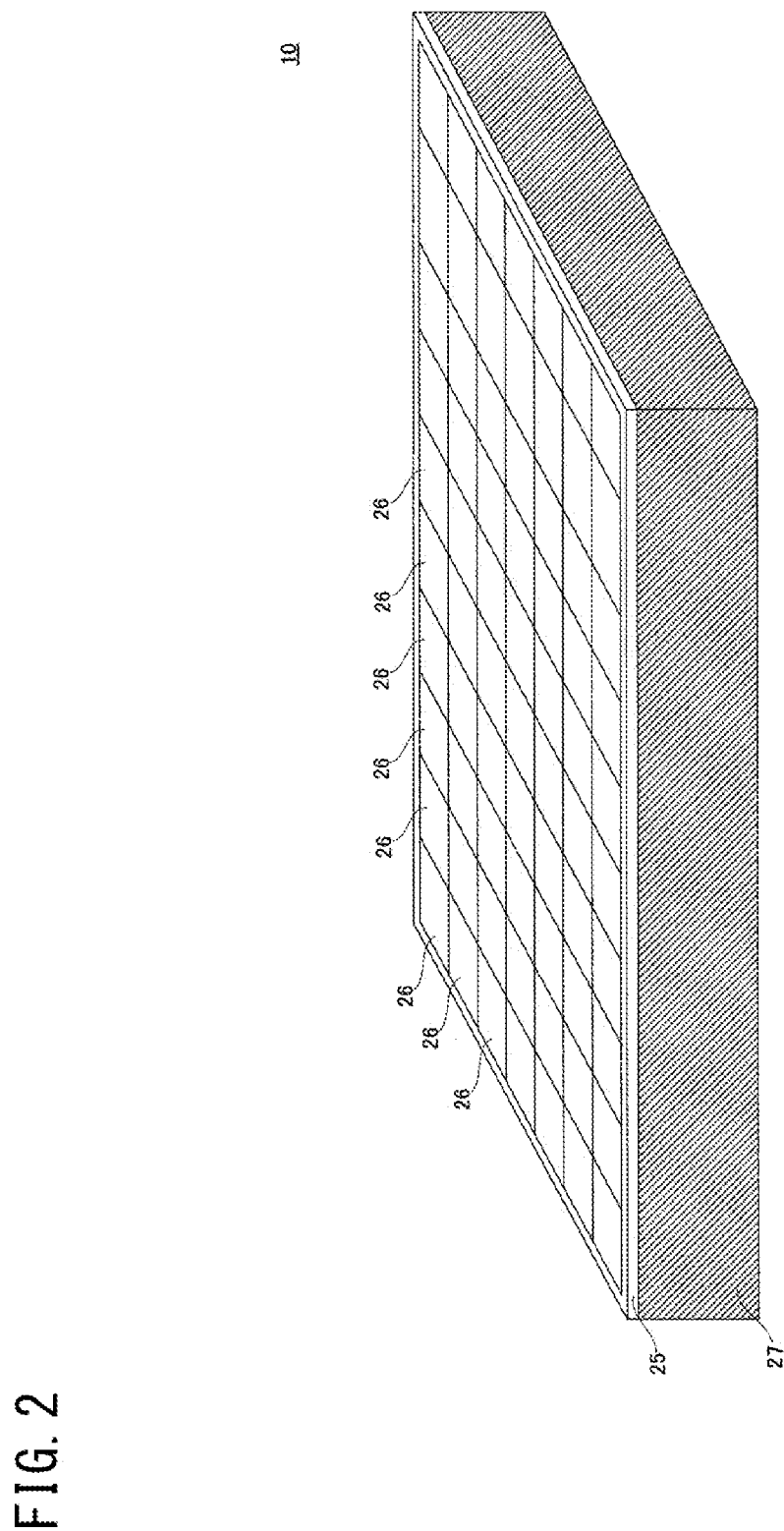
FIG. 2 is a perspective view of the photovoltaic module according to the first embodiment of the present invention.
Figure 3:
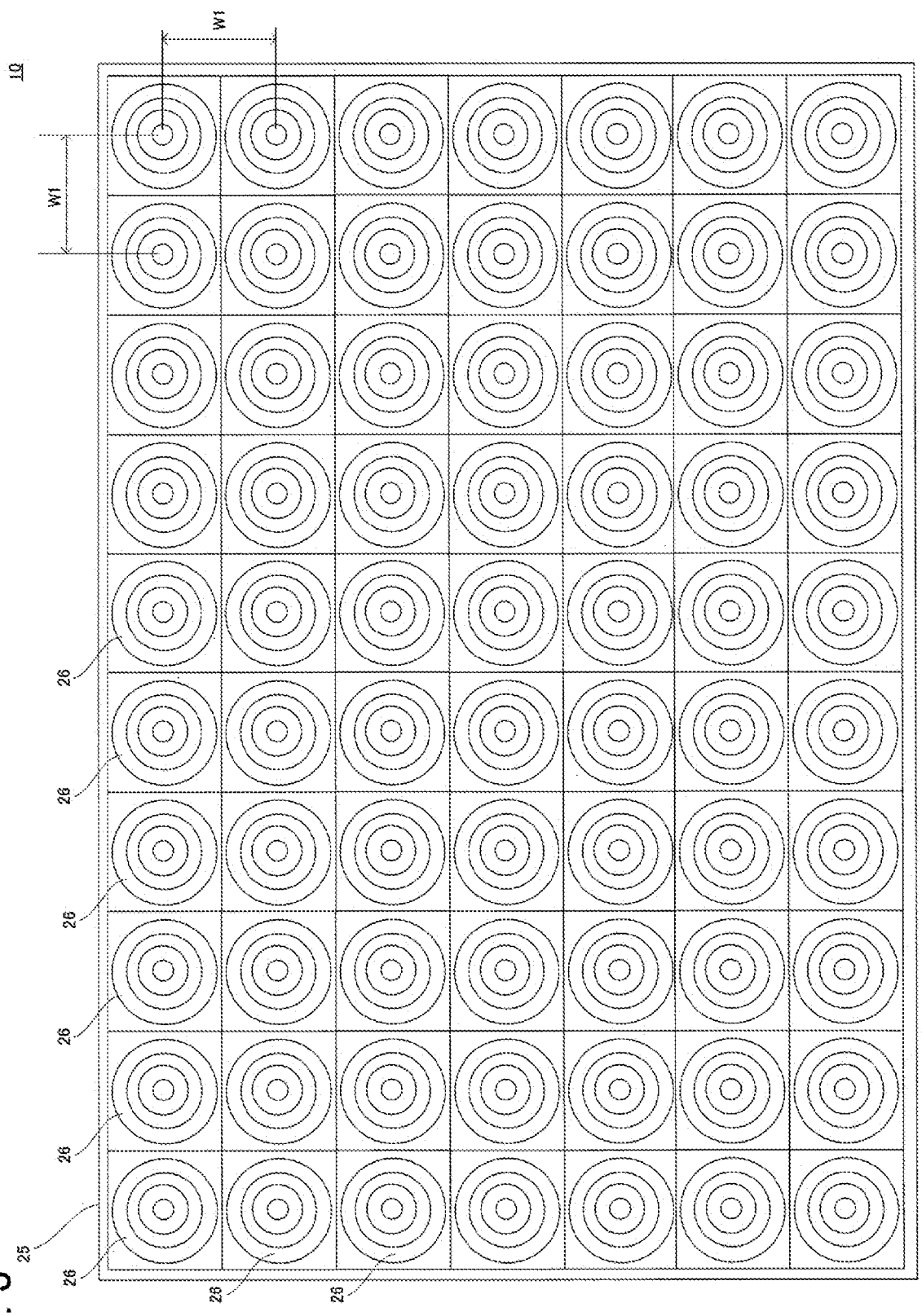
FIG. 3 is a plan view of the photovoltaic module according to the first embodiment of the present invention.

FIG. 2 is a perspective view of the photovoltaic module according to the first embodiment of the present invention. FIG. 3 is a plan view of the photovoltaic module according to the first embodiment of the present invention.

With reference to FIG. 2 and FIG. 3, the photovoltaic module 10 includes a wall portion 27, a bottom not shown, and a concentrating portion 25. The concentrating portion 25 includes a plurality of Fresnel lenses 26.

In the concentrating portion 25, the Fresnel lenses 26 are arranged in a square lattice pattern, for example. Specifically, the Fresnel lenses 26 are arranged such that the distance between the centers of Fresnel lenses 26 that are adjacent to each other is W1, for example. The size of each Fresnel lens 26 is 50 mm×50 mm, for example.

Figure 4:
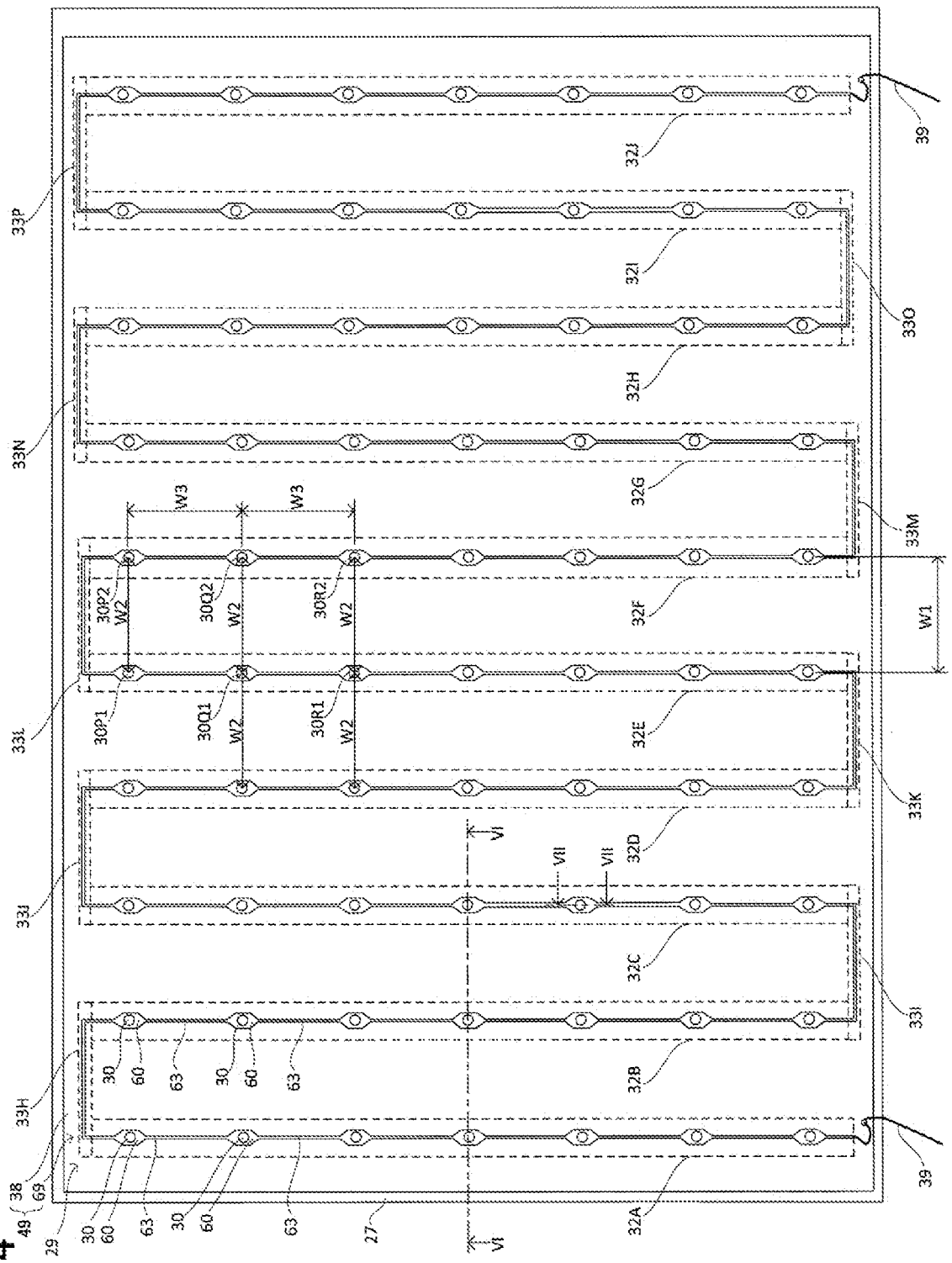
FIG. 4 is a plan view showing a state of the photovoltaic module with a concentrating portion removed according to the first embodiment of the present invention.

FIG. 4 is a plan view showing a state of a photovoltaic module with the concentrating portion removed according to the first embodiment of the present invention.

With reference to FIG. 4, the photovoltaic module 10 includes the wall portion 27, a wiring module 49, a plurality of power generating portions 30, and two lead wires 39. The wiring module 49 includes: a base portion 38 being the bottom of the photovoltaic module 10; and a wiring substrate 69.

The wiring substrate 69 includes: strip-shaped substrates 32A, 32B, 32C, 32D, 32E, 32F, 32G, 32H, 32I, and 32J; and coupling portions 33H, 33I, 33J, 33K 33L 33M, 33N, 33O, and 33P.

The coupling portion 33H couples the strip-shaped substrate 32A and the strip-shaped substrate 32B together. The coupling portion 33I couples the strip-shaped substrate 32B and the strip-shaped substrate 32C together. The coupling portion 33J couples the strip-shaped substrate 32C and the strip-shaped substrate 32D together. The coupling portion 33K couples the strip-shaped substrate 32D and the strip-shaped substrate 32E together. The coupling portion 33L couples the strip-shaped substrate 32E and the strip-shaped substrate 32F together. The coupling portion 33M couples the strip-shaped substrate 32F and the strip-shaped substrate 32G together. The coupling portion 33N couples the strip-shaped substrate 32G and the strip-shaped substrate 32H together. The coupling portion 33O couples the strip-shaped substrate 32H and the strip-shaped substrate 32I together. The coupling portion 33P couples the strip-shaped substrate 32I and the strip-shaped substrate 32J together.

Hereinafter, each of the strip-shaped substrates 32A, 32B, 32C, 32D, 32E, 32F, 32G, 32H, 32I, and 32J will also be referred to as a strip-shaped substrate 32. In addition, each of the coupling portions 33H, 33I, 33J, 33K, 33L, 33M, 33N, 33O, and 33P will also be referred to as a coupling portion 33. The strip-shaped substrates 32 are arranged parallel to each other.

It should be noted that the wiring substrate 69 may be configured to include a larger number of or a smaller number of the strip-shaped substrates 32. For example, the wiring substrate 69 may be configured to include a single strip-shaped substrate 32.

The wiring substrate 69, specifically, each strip-shaped substrate 32 of the wiring substrate 69 has an elongated shape. The strip-shaped substrate 32 of the wiring substrate 69 has a length along the extending direction. The wiring substrate 69 has a thickness. The wiring substrate 69 has a width along a direction that crosses the length direction and the thickness direction of the wiring substrate 69.

The lead wires 39 are respectively connected to the two ends of the wiring substrate 69. The lead wires 39 respectively pass through holes provided in the base portion 38, and are connected to the junction box in the function part 90 shown in FIG. 1, for example. The material of the base portion 38 is, for example, aluminium, copper, or the like which has a high heat conductivity and a relatively light weight.

The wiring substrate 69 is placed at and adhered to the upper main surface of the base portion 38, i.e., the main surface on the Fresnel lens 26 side of the base portion 38.

In the wiring module 49, the strip-shaped substrate 32 of the wiring substrate 69 includes seven land portions 60 and wire portions 63 each connected to opposite sides of each land portion. Each wire portion 63 connects the land portions 60 together, for example. The width of the land portion 60 is greater than the width of the wire portion 63.

Each power generating portion 30 is mounted to the upper main surface of its corresponding land portion 60. It should be noted that the strip-shaped substrate 32 in the wiring substrate 69 may be configured to include a larger number of or a smaller number of the land portions 60 and the wire portions 63. For example, the strip-shaped substrate 32 may be configured to include a single land portion 60 and a single wire portion 63.

For example, the strip-shaped substrate 32E includes power generating portions 30P1, 30Q1, and 30R1 mounted thereto as the power generating portions 30. The strip-shaped substrate 32F includes power generating portions 30P2, 30Q2, and 30R2 mounted thereto as the power generating portions 30.

The power generating portion 30P1 and the power generating portion 30P2 are arranged along a direction perpendicular to the extending direction of the strip-shaped substrate 32 and are adjacent to each other. The power generating portion 30Q1 and the power generating portion 30Q2 are arranged along a direction perpendicular to the extending direction of the strip-shaped substrate 32 and are adjacent to each other. The power generating portion 30R1 and the power generating portion 30R2 are arranged along a direction perpendicular to the extending direction of the strip-shaped substrate 32 and are adjacent to each other.

A distance W2 between the power generating portions 30 that are arranged along a direction perpendicular to the extending direction of the strip-shaped substrate 32 and that are adjacent to each other is equal to a distance W3 between the power generating portions 30 that are adjacent to each other in the strip-shaped substrate 32. Specifically, for example, the distance W2 between the power generating portion 30P1 and the power generating portion 30P2 is equal to the distance W3 between the power generating portion 30P2 and power generating portion 30Q2.

For example, the distance W2 and the distance W3 are equal to the distance W1 between the centers of the Fresnel lenses 26 shown in FIG. 3.

For example, each Fresnel lenses 26 shown in FIG. 3 is provided for one power generating portion 30, correspondingly. Each power generating portion 30 is disposed on the optical axis of its corresponding Fresnel lens 26.

The photovoltaic module 10 includes a power generation module 29. The power generation module 29 includes: the wiring substrate 69 and the power generating portions 30 mounted to the wiring substrate 69. In the power generation module 29, the wiring substrate 69 includes the land portions 60 and the wire portions 63 described above.

Figure 5:
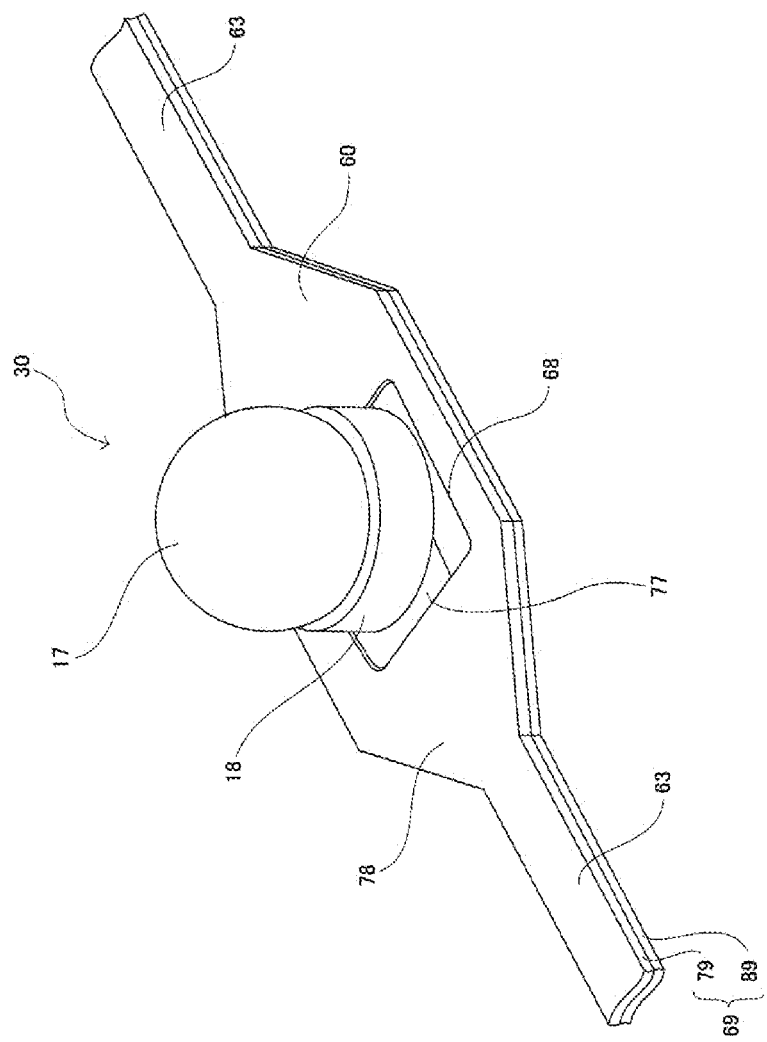
FIG. 5 is a perspective view showing a state of a power generating portion mounted to a wiring substrate according to the first embodiment of the present invention.

FIG. 5 is a perspective view showing a state of the power generating portion mounted to the wiring substrate according to the first embodiment of the present invention.

With reference to FIG. 5, the wiring substrate 69 includes an FPC (flexible printed circuit) 79, and a reinforcement plate 89. The FPC 79 includes a conductive portion 77 and an insulating portion 78 which covers the conductive portion 77.

The power generating portion 30 is mounted to the land portion 60 of the wiring substrate 69. Specifically, in the land portion 60, an opening 68 is provided in the FPC 79. In the opening 68, the insulating portion 78 does not cover the upper side of the conductive portion 77, and thus, the conductive portion 77 is exposed. The power generating portion 30 is electrically connected to the conductive portion 77 in the opening 68.

The reinforcement plate 89 is provided to the main surface on the base portion 38 side of the strip-shaped substrate 32 in the wiring substrate 69, and provides slight hardness to the strip-shaped substrate 32, thereby facilitating handling of the wiring substrate 69 during production of the photovoltaic module 10. The reinforcement plate 89 is formed of metal such as aluminium, copper, or the like.

Figure 6:
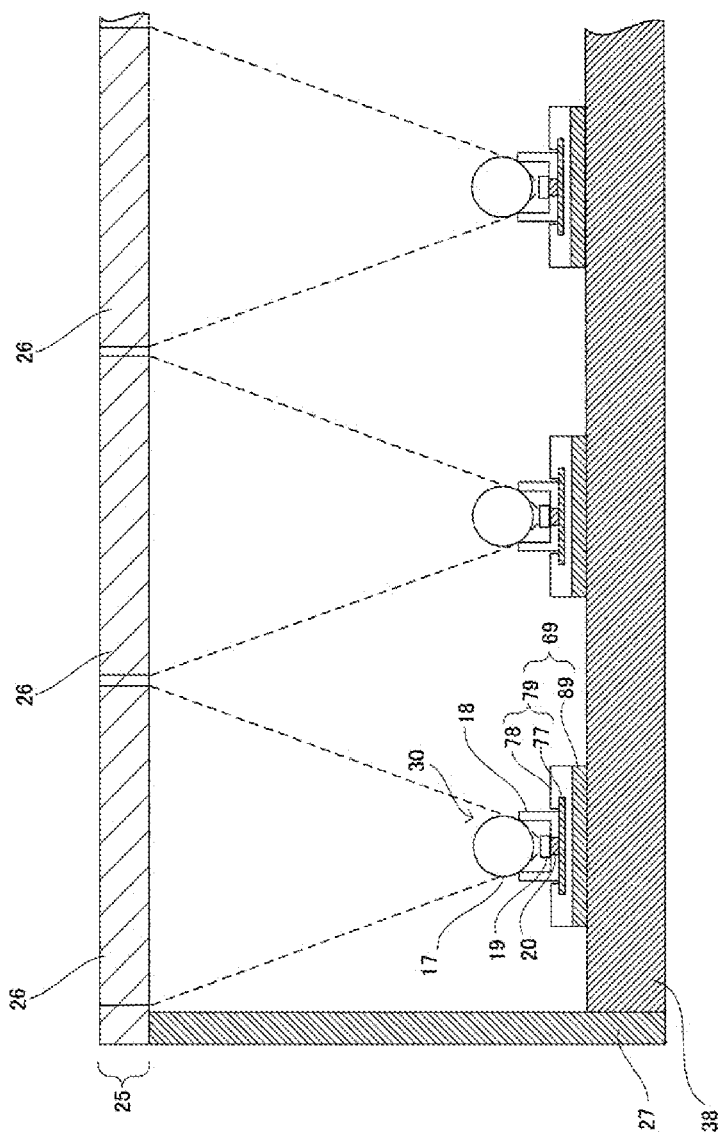
FIG. 6 is a cross-sectional view showing a cross section, along a VI-VI line in FIG. 4, of the photovoltaic module according to the first embodiment of the present invention.

FIG. 6 is a cross-sectional view showing a cross section, along the VI-VI line in FIG. 4, of the photovoltaic module according to the first embodiment of the present invention.

With reference to FIG. 6, each power generating portion 30 includes a ball lens 17, a package 18, and a power generating element 19. It should be noted that the power generating portion 30 may be configured not to include, except the power generating element 19, any or some of these components.

The wiring substrate 69 is placed at the upper main surface of the base portion 38. The reinforcement plate 89 is provided above the base portion 38. The FPC 79 is provided above the reinforcement plate 89. Specifically, the FPC 79 is provided above the base portion 38 via the reinforcement plate 89.

The power generating element 19 is housed in the package 18. The power generating element 19 is mounted to the FPC 79 in a state of being housed in the package 18. Specifically, an electrode not shown of the power generating element 19 is connected to the conductive portion 77 of the FPC 79, via a package electrode 20 provided so as to penetrate the bottom of the package 18. The size of power generating element 19 is 3.2 mm×3.2 mm, for example.

Each Fresnel lens 26 converges sunlight onto its corresponding ball lens 17. The ball lens 17 further converges the sunlight converged by the Fresnel lens 26, onto the power generating element 19.

The power generating element 19 receives the sunlight converged by the Fresnel lens 26 and the ball lens 17, and generates power corresponding to the amount of the received light.

Figure 7:
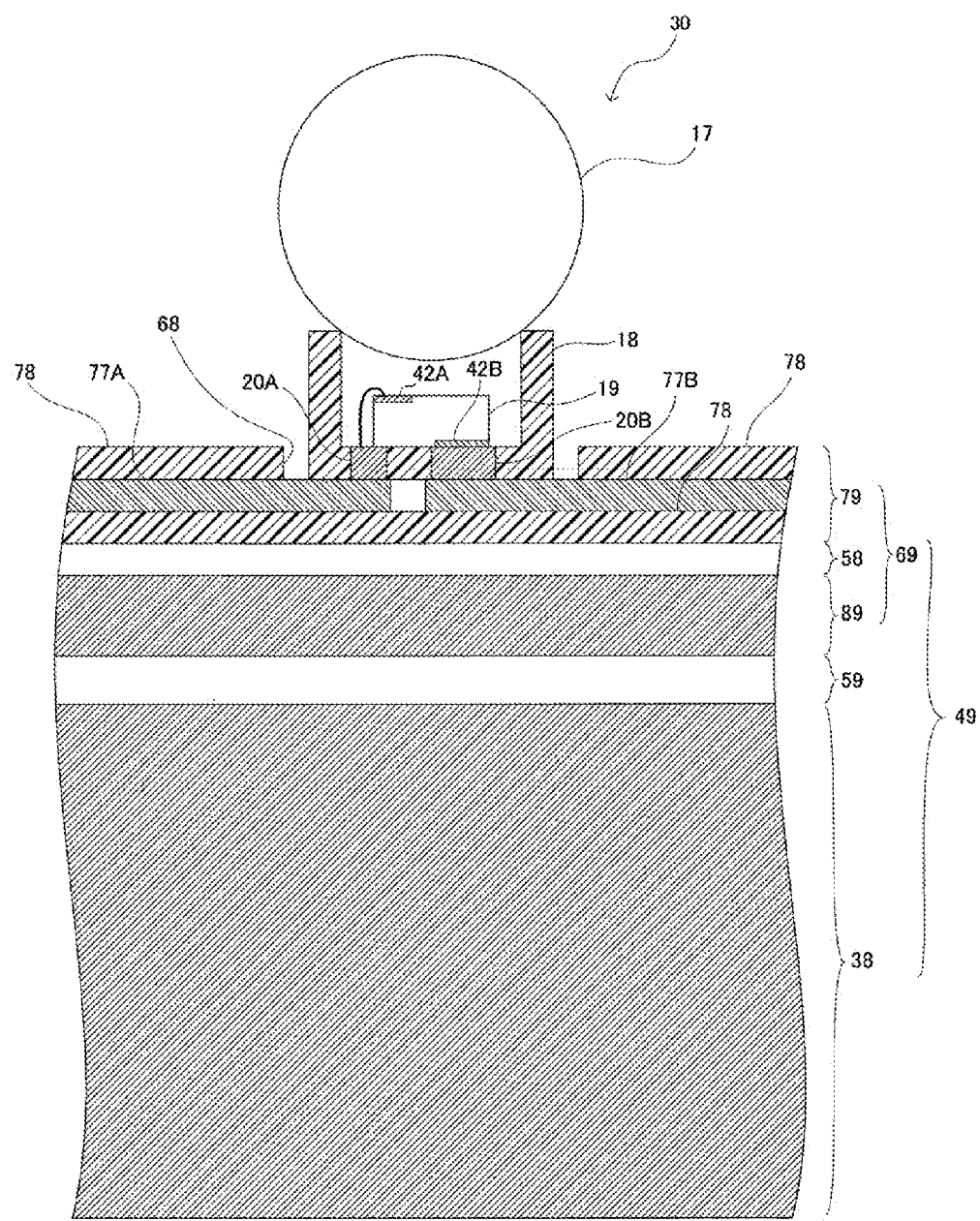
FIG. 7 is a cross-sectional view of a cross section, along a VII-VII line in FIG. 4, of a wiring module and the power generating portion in the photovoltaic module according to the first embodiment of the present invention.

FIG. 7 is a cross-sectional view showing a cross section, along the VII-VII line in FIG. 4, of the wiring module and the power generating portion in the photovoltaic module according to the first embodiment of the present invention.

FIG. 7 also shows an adhesive layer not shown in FIG. 5, for example. Specifically, with reference to FIG. 7, the power generating portion 30 is mounted to the wiring module 49, specifically, to the wiring substrate 69 of the wiring module 49. In the wiring substrate 69, the FPC 79 and the reinforcement plate 89 are adhered together by an intra-substrate adhesive layer 58. The wiring substrate 69 and the base portion 38 are adhered together by a base adhesive layer 59. The intra-substrate adhesive layer 58 and the base adhesive layer 59 are each formed from an adhesive agent, an adhesive tape, or the like, for example.

The power generating element 19 includes an element electrode 42A and an element electrode 42B, and outputs voltage from the element electrode 42A and the element electrode 42B.

The package 18 includes a package electrode 20A and a package electrode 20B. The package electrode 20A and the package electrode 20B are provided so as to penetrate the bottom of the package 18, and are exposed both on the upper side and the lower side of the bottom.

The element electrode 42A of the power generating element 19 is connected to the package electrode 20A by wire bonding, for example. The element electrode 42B is connected to the package electrode 20B by a conductive paste, for example.

In the opening 68 in the FPC 79, the insulating portion 78 does not cover the upper side of the conductive portion 77, and thus, a part of the conductive portion 77, specifically, a part of a conductive portion 77A and a part of a conductive portion 77B, is exposed.

The package electrode 20A and the package electrode 20B are connected by, for example, soldering to the conductive portion 77A and the conductive portion 77B, respectively.

The package 18 supports the ball lens 17 at the edge of the side wall of the package 18, and fixes the focal point of the ball lens 17 to the power generating element 19.

Figure 8:
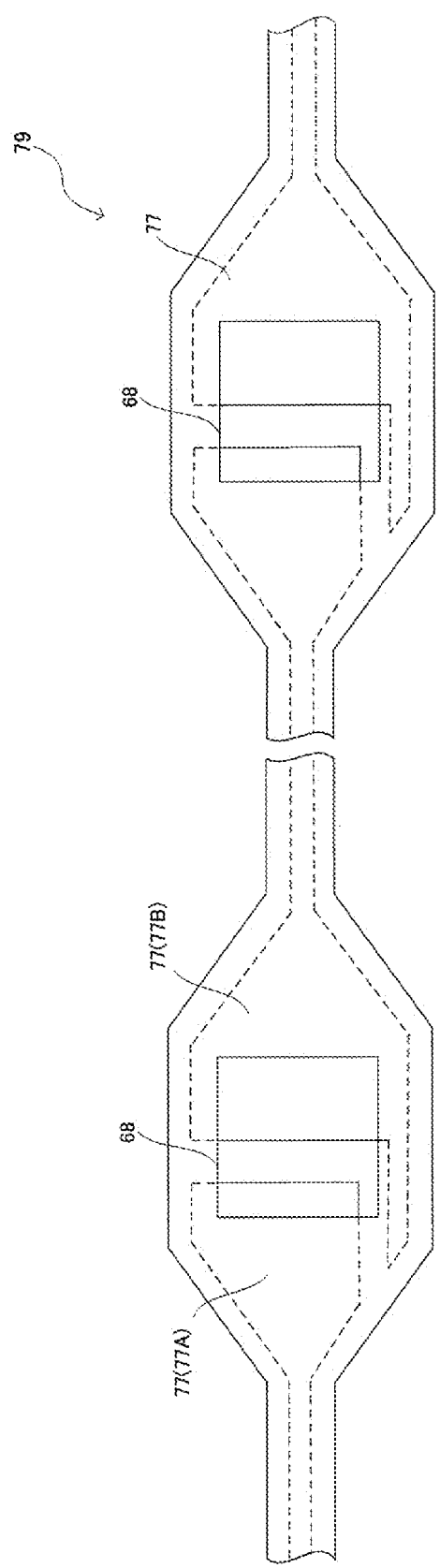
FIG. 8 shows a pattern of a conductive portion of an FPC in the wiring substrate according to the first embodiment of the present invention.

FIG. 8 shows a pattern of the conductive portion of the FPC in the wiring substrate according to the first embodiment of the present invention.

With reference to FIG. 8, in the opening 68 of the FPC 79, a part of the conductive portion 77 is exposed. Specifically, in the opening 68, a part of the conductive portion 77A and a part of the conductive portion 77B are exposed.

As shown in FIG. 7, for example, the conductive portion 77A and the conductive portion 77B are connected to the element electrode 42A and the element electrode 42B of the power generating element 19, respectively.

The conductive portion 77 connects, in series, the power generating portion 30 mounted in a land portion 60 and the power generating portion 30 mounted in another land portion 60 adjacent to the land portion 60, for example.

Figure 9:
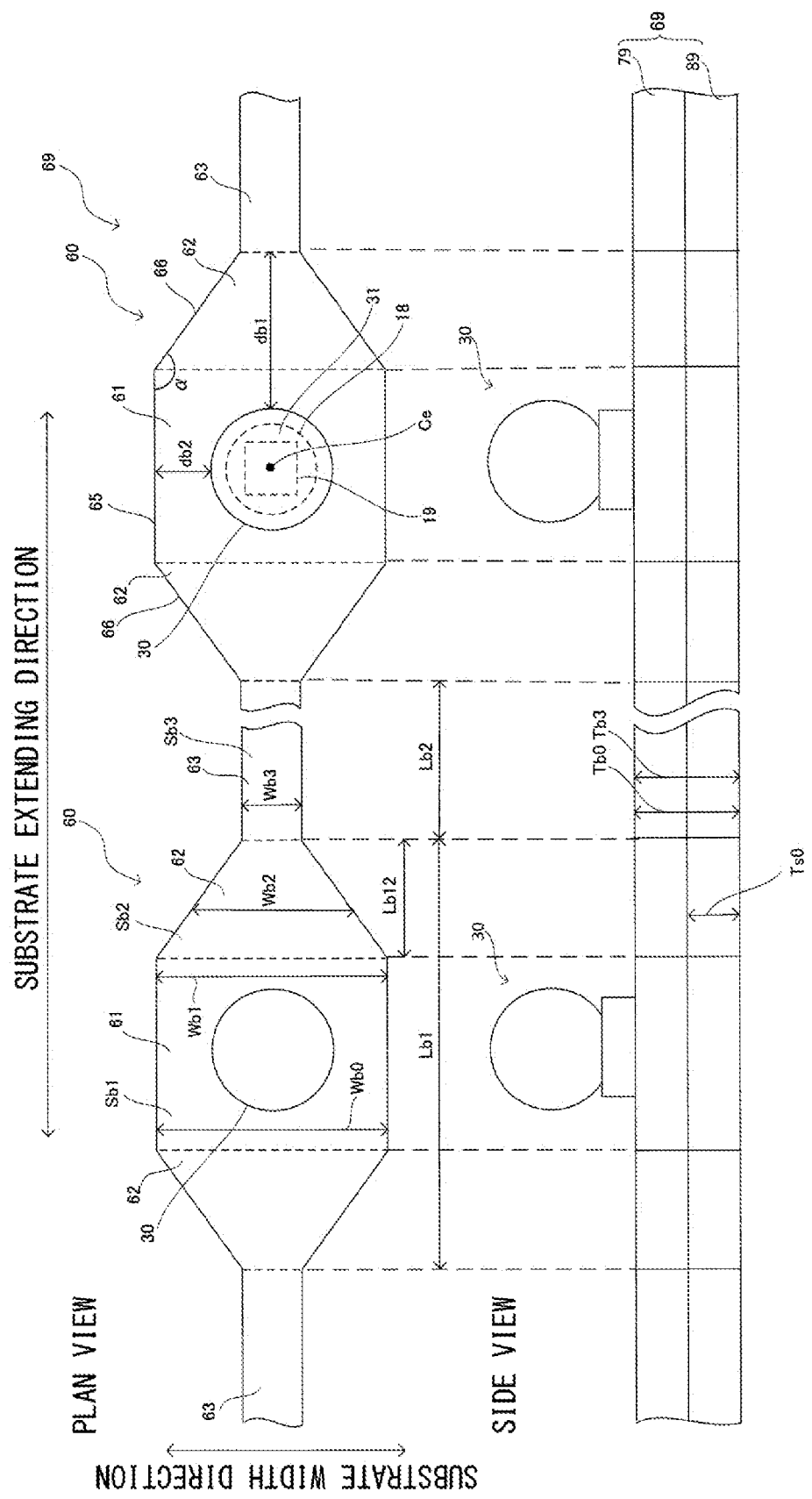
FIG. 9 shows the wiring substrate according to the first embodiment of the present invention.

FIG. 9 shows the wiring substrate according to the first embodiment of the present invention.

FIG. 9 shows a plan view and a side view of a part of the wiring substrate 69, specifically, a part of the strip-shaped substrate 32 in the wiring substrate 69. With reference to FIG. 9, the wiring substrate 69 to which the power generating portions 30 are mounted includes a plurality of the land portions 60 and a plurality of the wire portions 63, as described above.

Each land portion 60 has a shape that allows the power generating portion 30 to be mounted to the upper side of the land portion 60, i.e., the main surface on the Fresnel lens 26 side of the land portion 60. That is, the land portion 60 has a space that allows the power generating portion 30 to be mounted therein. In addition, the land portion 60 has a length Lb1 along the extending direction of the wiring substrate 69.

The power generating portion 30 including the power generating element 19 is mounted to the land portion 60. The wire portion 63 is electrically connected to the power generating element 19. The wire portion 63 electrically connects the land portions 60 that are adjacent to each other, i.e., the power generating portions 30 that are adjacent to each other. The wire portion 63 has a length Lb2 along the extending direction of the wiring substrate 69.

The length Lb2 of the wire portion 63 is greater than the length Lb1 of the land portion 60. That is, the length Lb2 of the wire portion 63 in the extending direction of the wiring substrate 69 is greater than the length Lb1 of the land portion 60 in the extending direction. Hereinafter, the extending direction of the wiring substrate 69 will also be referred to as a substrate extending direction.

A width Wb3 of the wire portion 63 is smaller than a width Wb0 of the land portion 60. The width Wb0 of the land portion 60 and the width Wb3 of the wire portion 63 respectively are the length of the land portion 60 and the length of the wire portion 63 in a direction that crosses the substrate extending direction, specifically, for example, in a direction perpendicular to the substrate extending direction. Hereinafter, the direction that crosses the substrate extending direction, i.e., the width direction of the land portion 60, will also be referred to as a substrate width direction.

The width Wb0 of the land portion 60 is not less than 200% and not greater than of 1000% of the width Wb3 of the wire portion 63, for example.

The length Lb1 in the substrate extending direction of the land portion 60 is greater than the width Wb0 of the land portion 60.

For example, the land portion 60 has an inside region 61 and two outside regions 62. The outside regions 62 are respectively connected to both ends in the substrate extending direction of the inside region 61. That is, the outside regions 62 are respectively positioned at both ends in the length direction of the land portion 60 and connected to the inside region 61. That is, each outside region 62 is connected between an end in the substrate extending direction of the inside region 61 and a wire portion 63.

The number of the outside regions 62 of the land portion 60 may be one. In this case, the outside region 62 is connected to either one of the ends in the substrate extending direction of the inside region 61, for example. That is, the outside region 62 is positioned at one end in the length direction of the land portion 60, and is connected to the inside region 61.

The inside region 61 has a width Wb1 that corresponds to the width Wb0 of the land portion 60. The outside region 62 has a width Wb2. The width Wb1 of the inside region 61 and the width Wb2 of the outside region 62 are the length of the inside region 61 and the length of the outside region 62 in the substrate width direction, respectively.

For example, the width Wb2 of the outside region 62 is smaller than the width Wb1 of the inside region 61. In addition, for example, the width Wb2 of the outside region 62 is greater than the width Wb3 of the wire portion 63.

For example, the width Wb2 of the outside region 62 continuously becomes smaller from the inside region 61 toward the wire portion 63. That is, the width Wb2 of the outside region 62 continuously becomes smaller toward the wire portion 63 to which the outside region 62 is connected.

The outside region 62 has a length Lb12 along the extending direction of the wiring substrate 69. For example, the relationship between the width Wb2 of the outside region 62 and the length Lb12 of the outside region 62, i.e., the length Lb12 in the substrate extending direction of the outside region 62, is expressed by the formula (1) below.

$$0 < Lb12/Wb2 \leq 10 \quad (1)$$

For example, an area Sb1 of the inside region 61 is greater than an area Sb2 of the outside region 62. Specifically, for example, the area Sb1 of the inside region 61 is not less than 200% and not greater than 1000% of the area Sb2 of the outside region 62.

The wiring substrate 69 includes the FPC 79 and the reinforcement plate 89 as described above, for example. That is, each land portion 60 and each wire portion 63 include the reinforcement plate 89.

For example, in a plan view from above the wiring substrate 69, specifically, in a plan view in a direction from above the wiring substrate 69 toward the mounting surface for the power generating portion 30, the land portion 60 has a shape that allows the power generating portion 30 to be disposed such that a center portion of the power generating portion 30, specifically, the center Ce of the power generating portion 30, is positioned in the inside region 61. In a plan view from above the wiring substrate 69, the power generating portion 30 is disposed such that the center Ce of the power generating portion 30 is included in the inside region 61.

For example, in a plan view from above the wiring substrate 69, a distance db1 from the power generating portion 30 to the wire portion 63 in the substrate extending direction is greater than a distance db2 from the power generating portion 30 to an end of the land portion 60 in the substrate width direction.

For example, the wiring substrate 69 has an electrode for soldering the power generating portion 30. Specifically, for example, the electrode is the exposed portion of the conductive portion 77 in the opening 68 shown in FIG. 8, and is provided so as to be included in the inside region 61.

The land portion 60 has a mounting region 31 that comes into contact with the power generating portion 30 when the power generating portion 30 is mounted to the land portion 60. For example, not less than 80% of the mounting region 31 is positioned in the inside region 61. In other words, for example, 80% to 100% of the mounting region 31 is included in the inside region 61, the mounting region 31 being the region where the power generating portion 30 is mounted in the land portion 60. In the example shown in FIG. 9, 100% of the mounting region 31 is included in the inside region 61.

For example, a thickness Tb3 of the wire portion 63 is not less than 1% and not greater than 50% of the width Wb3 of the wire portion 63.

The reinforcement plate 89 has a thickness Ts0. For example, the thickness Ts0 of the reinforcement plate 89 is not less than 10% and not greater than 90% of a thickness Tb0 of the wiring substrate 69.

The inside region 61 has edges 65. Each edge 65 is positioned at an end of the inside region 61 in the substrate width direction. The outside region 62 has edges 66. Each edge 66 is positioned at an end of the outside region 62 in the substrate width direction.

The edge 65 and the edge 66 are connected to each other. An angle $\alpha$ between the edge 65 and the edge 66 is greater than 90 degrees and not greater than 170 degrees, for example.

Figure 10:
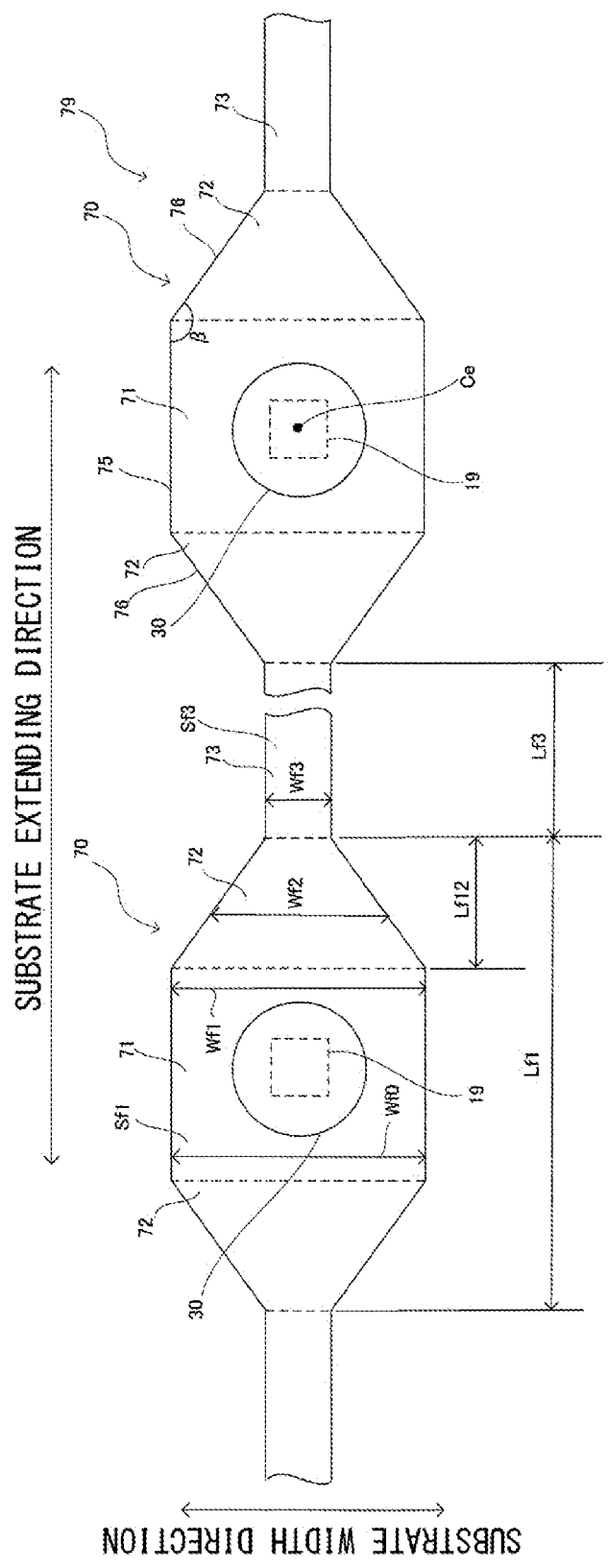
FIG. 10 shows the FPC in the wiring substrate according to the first embodiment of the present invention.

FIG. 10 shows the FPC in the wiring substrate according to the first embodiment of the present invention.

With reference to FIG. 10, the FPC 79 includes a plurality of FPC land portions 70 and a plurality of FPC wire portions 73. The FPC land portion 70 and the FPC wire portion 73 are included in the land portion 60 and the wire portion 63 shown in FIG. 9, respectively.

The power generating portion 30 is mounted to the FPC land portion 70. The FPC wire portion 73 connects the FPC land portions 70 together, i.e., the power generating portions 30 together.

The FPC land portion 70 has a length Lf1 along the extending direction of the wiring substrate 69. The FPC wire portion 73 has a length Lf3 along the extending direction of the wiring substrate 69. The length Lf3 of the FPC wire portion 73 is greater than the length Lf1 of the FPC land portion 70. That is, the length Lf3 in the substrate extending direction of the FPC wire portion 73 is greater than the length Lf1 in the substrate extending direction of the FPC land portion 70.

Specifically, for example, the length Lf3 in the substrate extending direction of the FPC wire portion 73 is greater than 100% and not greater than 600% of the length Lf1 in the substrate extending direction of the FPC land portion 70.

A width Wf3 of the FPC wire portion 73 is smaller than a width Wf0 of the FPC land portion 70. Specifically, for example, the width Wf3 of the FPC wire portion 73 is not less than 0.1% and not greater than 50% of the width Wf0 of the FPC land portion 70.

For example, an area Sf1 of the FPC land portion 70 is not less than 20% and not greater than 1000% of an area Sf3 of the FPC wire portion 73.

For example, the FPC land portion 70 has an inside region (first region) 71 and two outside regions (second regions) 72. The inside region 71 has a width Wf1. The outside regions 72 each have a width Wf2. The outside regions 72 are respectively positioned at both ends in the length direction of the FPC land portion 70 and connected to the inside region 71.

In other words, for example, the outside regions 72 are respectively connected to both ends in the substrate extending direction of the inside region 71. Specifically, each outside region 72 is connected between an end in the substrate extending direction of the inside region 71 and a FPC wire portion 73.

The number of the outside regions 72 of the FPC land portion 70 may be one. In this case, the outside region 72 is connected to either one of the ends in the substrate extending direction of the inside region 71. That is, the outside region 72 is positioned at one end in the length direction of the FPC land portion 70, and is connected to the inside region 71.

The inside region 71 has the width Wf1 that corresponds to the width Wf0 of the FPC land portion 70. The outside region 72 has the width Wf2. The width Wf1 of the inside region 71 and the width Wf2 of the outside region 72 are the length of the inside region 71 and the length of the outside region 72 in the substrate width direction, respectively.

For example, the width Wf2 of the outside region 72 is smaller than the width Wf1 of the inside region 71. In addition, for example, the width Wf2 of the outside region 72 is greater than the width Wf3 of the FPC wire portion 73.

For example, the width Wf2 of the outside region 72 continuously becomes smaller from the inside region 71 toward the FPC wire portion 73. That is, the width Wf2 of the outside region 72 continuously becomes smaller toward the FPC wire portion 73 connected to the outside region 72.

For example, the outside region 72 has a length Lf12 along the extending direction of the wiring substrate 69. The relationship between the width Wf2 of the outside region 72 and the length Lf12 of the outside region 72, i.e., the length Lf12 in the substrate extending direction of the outside region 72, is expressed by the formula (2) below.

$$0 < Lf12/Wf2 \leq 10 \quad (2)$$

For example, in a plan view from above the wiring substrate, the power generating portion 30 is disposed such that a center portion of the power generating portion 30, specifically, the center Ce of the power generating portion 30, is included in the inside region 71.

For example, the FPC 79 has an electrode for soldering the power generating portion 30. Specifically, for example, the electrode is the exposed portion of the conductive portion 77 in the opening 68 shown in FIG. 8, and is provided so as to be included in the inside region 71.

The inside region 71 has edges 75. Each edge 75 is positioned at an end of the inside region 71 in the width direction of the FPC land portion 70, i.e., in the substrate width direction. The outside region 72 has edges 76. Each edge 76 is positioned at an end of the outside region 72 in the substrate width direction.

The edge 75 and the edge 76 are connected to each other. An angle β between the edge 75 and the edge 76 is greater than 90 degrees and not greater than 170 degrees, for example.

Figure 11:
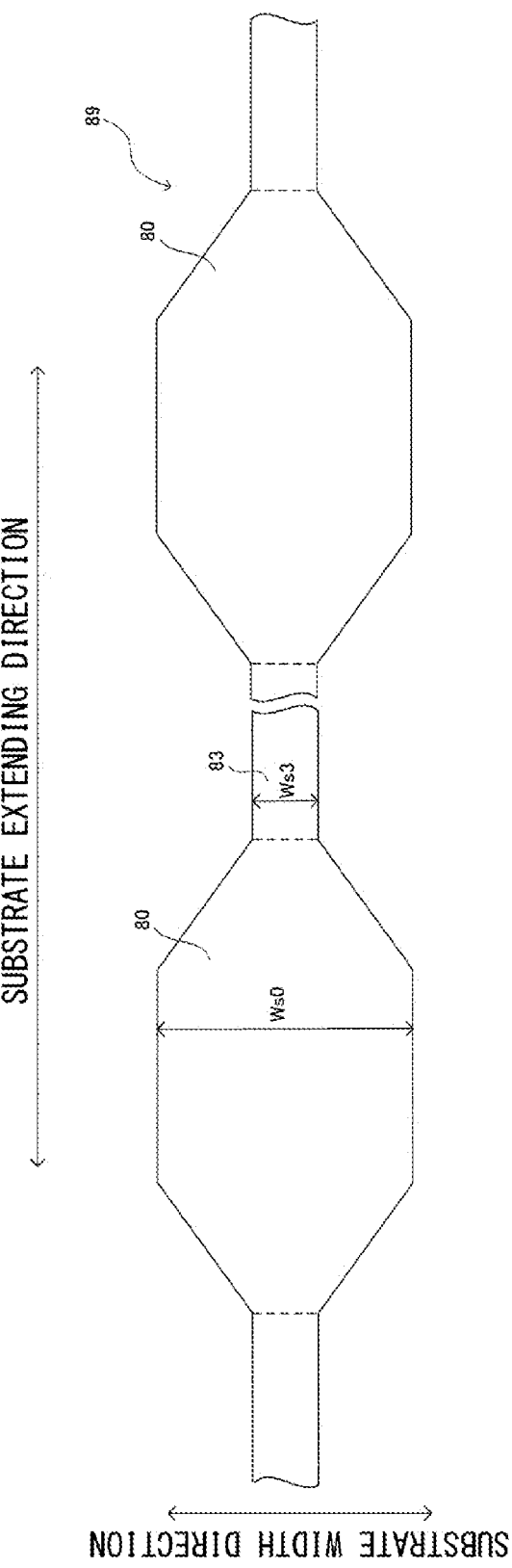
FIG. 11 shows a reinforcement plate in the wiring substrate according to the first embodiment of the present invention.

FIG. 11 shows the reinforcement plate in the wiring substrate according to the first embodiment of the present invention.

With reference to FIG. 11, the reinforcement plate 89 includes land reinforcement portions 80 and wire reinforcement portions 83. The land reinforcement portion 80 and the wire reinforcement portion 83 are included in the land portion 60 and the wire portion 63 shown in FIG. 9, respectively.

The land reinforcement portion 80 is adhered to the FPC land portion 70. The wire reinforcement portion 83 is adhered to the FPC wire portion 73. A width Ws3 of the wire reinforcement portion 83 is smaller than a width Ws0 of the land reinforcement portion 80.

Figure 12:
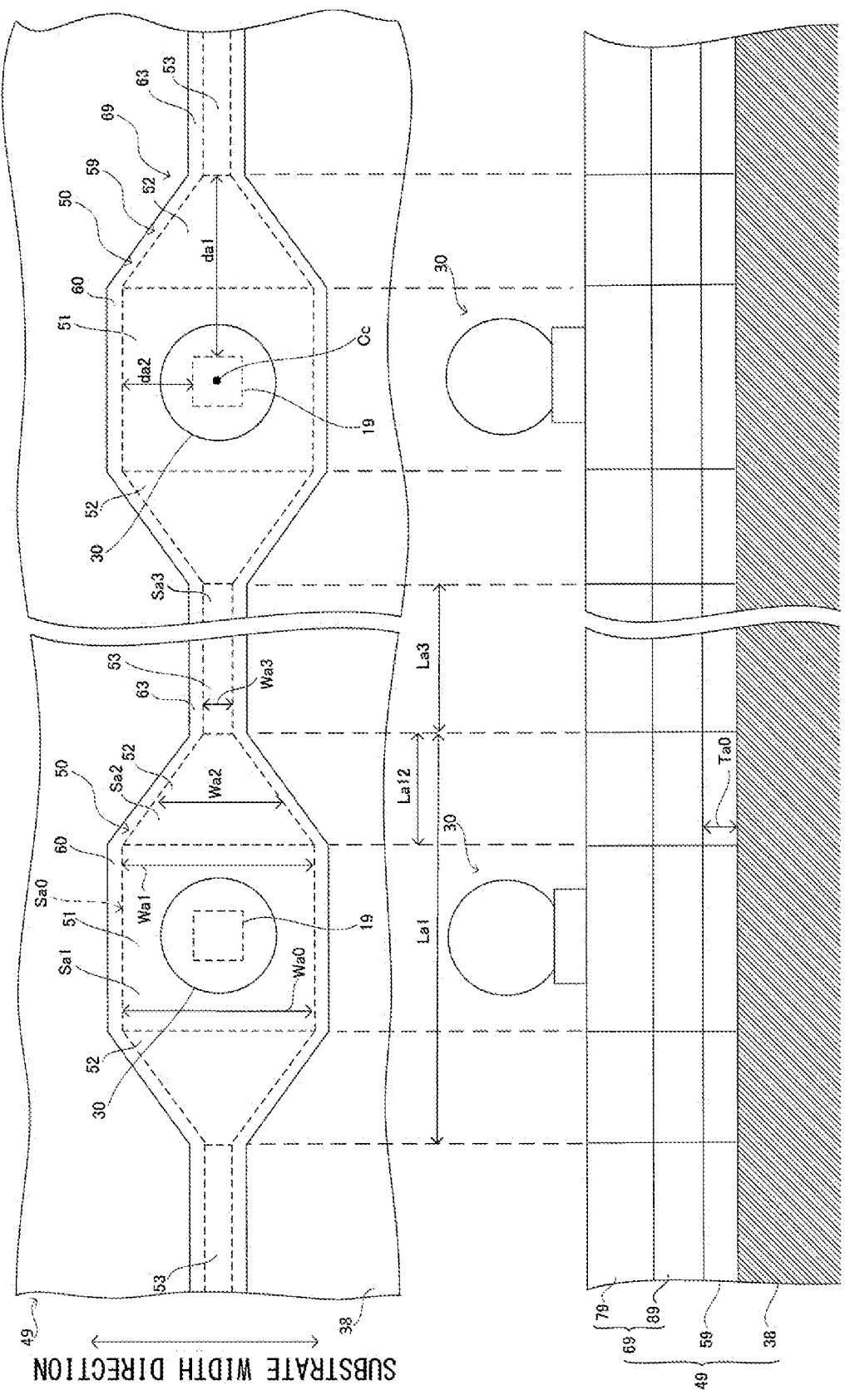
FIG. 12 shows the wiring module with the wiring substrate according to the first embodiment of the present invention.

FIG. 12 shows the wiring module with the wiring substrate according to the first embodiment of the present invention.

FIG. 12 shows a plan view and a side view of a state in which the wiring substrate 69 is adhered to the base portion 38 by the base adhesive layer 59, that is, a plan view and a side view of the wiring module 49.

With reference to FIG. 12, the base adhesive layer 59 includes: land adhesion regions 50 which adhere the land portions 60 of the wiring substrate 69 to the base portion 38; and wire adhesion regions 53 which adhere the wire portions 63 of the wiring substrate 69 to the base portion 38.

Specifically, the land adhesion region 50 adheres the land reinforcement portion 80 in the land portion 60 to the base portion 38. The wire adhesion region 53 adheres the wire reinforcement portion 83 in the wire portion 63 to the base portion 38.

A width Wa3 of the wire adhesion region 53 is smaller than a width Wa0 of the land adhesion region 50. Specifically, for example, the width Wa3 of the wire adhesion region 53 is not less than 0.1% and not greater than 50% of the width Wa0 of the land adhesion region 50.

It should be noted that the width Wa0 of the land adhesion region 50 may be smaller than the width Wb0 of the land portion 60 or may be equal to the width Wb0 of the land portion 60. In addition, the width Wa3 of the wire adhesion region 53 may be smaller than the width Wb3 of the wire portion 63 or may be equal to the width Wb3 of the wire portion 63.

The land adhesion region 50 has a length La1 along the substrate extending direction. The wire adhesion region 53 has a length La3 along the extending direction of the wiring substrate 69. The length La1 of the land adhesion region 50 is smaller than the length La3 of the wire adhesion region 53. In other words, the length La1 in the substrate extending direction of the land adhesion region 50 is smaller than the length La3 in the substrate extending direction of the wire adhesion region 53.

For example, the width Wa0 of the land adhesion region 50 is smaller than the length La1 in the substrate extending direction of the land adhesion region 50.

For example, an area Sa0 of the land adhesion region 50 is not less than 20% and not greater than 1000% of an area Sa3 of the wire adhesion region 53.

For example, a thickness Ta0 of the base adhesive layer 59 is not less than 0.25% and not greater than 5% of the width Wa0 of the land adhesion region 50. The thickness Ta0 of the base adhesive layer 59 is not less than 0.5% and not greater than 20% of the width Wa3 of the wire adhesion region 53.

The land adhesion region 50 has an inside region 51 and two outside regions 52, for example. The outside regions 52 are respectively positioned at both ends in the length direction of the land adhesion region 50 and are connected to the inside region 51. In other words, the outside regions 52 are respectively connected to both ends in the substrate extending direction of the inside region 51. Specifically, each outside region 52 is connected between an end in the substrate extending direction of the inside region 51 and a wire adhesion region 53.

The land adhesion region 50 may be configured to have one outside region 52, instead of two outside regions 52. In this case, the outside region 52 is positioned at one end in the length direction of the land adhesion region 50 and is connected to the inside region 51.

The inside region 51 has a width Wa1 that corresponds to the width Wa0. The outside region 52 has a width Wa2. The width Wa1 of the inside region 51 and the width Wa2 of the outside region 52 are the length of the inside region 51 and the length of the outside region 52 in the substrate width direction, respectively.

For example, the width Wa2 of the outside region 52 is smaller than the width Wa1 of the inside region 51. In addition, for example, the width Wa2 of the outside region 52 is greater than the width Wa3 of the wire adhesion region 53. For example, the width Wa2 of the outside region 52 continuously becomes smaller from the inside region 51 toward the wire adhesion region 53. That is, the width Wa2 of the outside region 52 continuously becomes smaller toward the wire adhesion region 53 connected to the outside region 52.

The outside region 52 has a length La12 along the extending direction of the wiring substrate 69. For example, the relationship between the width Wa2 of the outside region 52 and the length La12 of the outside region 52 is expressed by the formula (3) below.

$$0 < La12/Wa2 \le 10 \quad (3)$$

For example, an area Sa1 of the inside region 51 is not less than 200% and not greater than 1000% of an area Sa2 of the outside region 52.

In a plan view from above the wiring substrate 69, the power generating element 19 is disposed such that a center portion of the power generating element 19, specifically, the center Cc of the power generating element 19, is included in the inside region 51.

For example, in a plan view from above the wiring substrate 69, a distance da1 from the power generating element 19 to the wire adhesion region 53 in the substrate extending direction is greater than a distance da2 from the power generating element 19 to its corresponding end of the land adhesion region 50 in the width direction of the land adhesion region 50, i.e., in the substrate width direction.

Specifically, for example, in a plan view from above the wiring substrate 69, the distance da1 from the power generating element 19 to the wire adhesion region 53 in the substrate extending direction is not less than 200% and not greater than 2000% of the distance da2 from the power generating element 19 to the end of the land adhesion region 50 in the substrate width direction, for example.

[Modification]

FIG. 13 to FIG. 16 each show a modification of the wiring substrate according to the first embodiment of the present invention.

Figure 13:
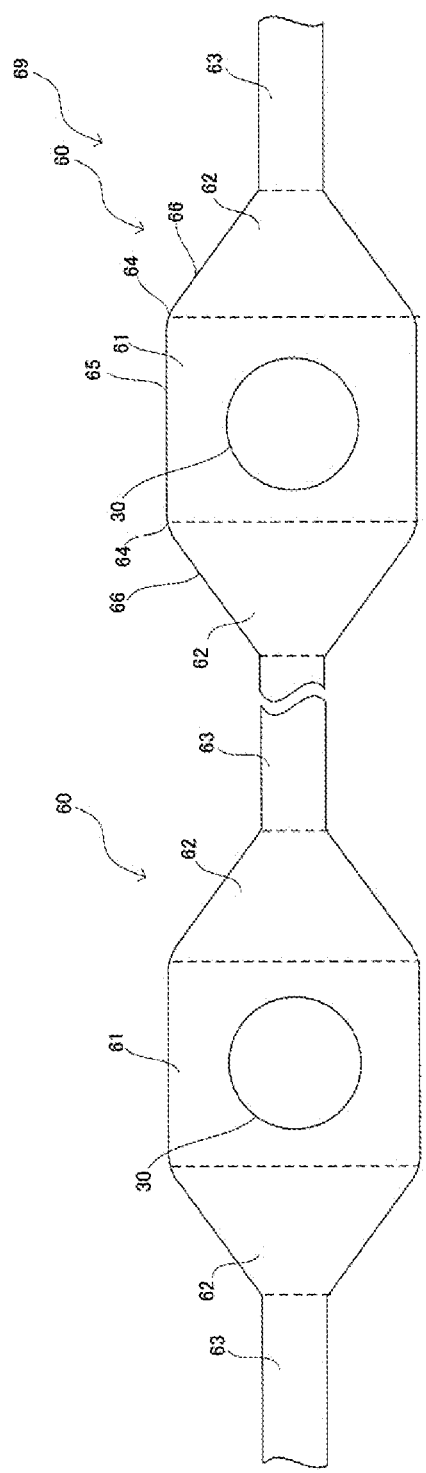
FIG. 13 shows a modification of the wiring substrate according to the first embodiment of the present invention.

With reference to FIG. 13, the shape of the land portion 60 is different from the shape of the land portion 60 shown in FIG. 9. Specifically, in the land portion 60, each connection portion 64 between the edge 65 positioned at an end of the inside region 61 and its corresponding edge 66 positioned at an end of the outside region 62 forms a curve. More specifically, the land portion 60 has a rounded hexagonal shape.

It should be noted that the connection portion 64 between the edge 65 and the edge 66 may form a continuous curve, i.e., a smoother curve. Specifically, the edge 65 and the edge 66 may form an arc, for example.

Figure 14:
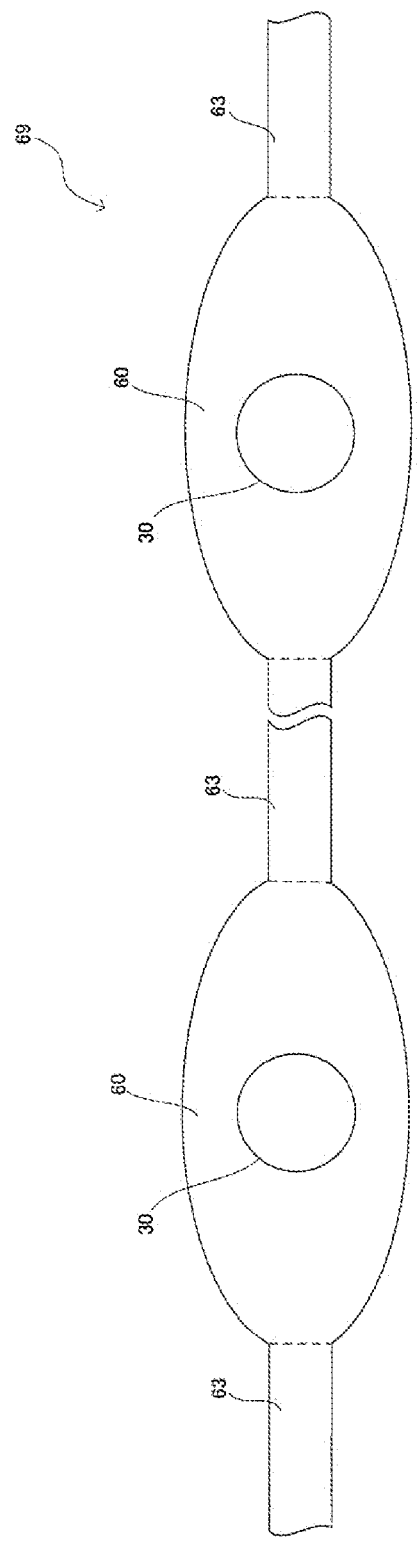
FIG. 14 shows a modification of the wiring substrate according to the first embodiment of the present invention.

With reference to FIG. 14, the shape of the land portion 60 is different from the shape of the land portion 60 shown in FIG. 9. Specifically, the land portion 60 has an elliptic shape.

Figure 15:
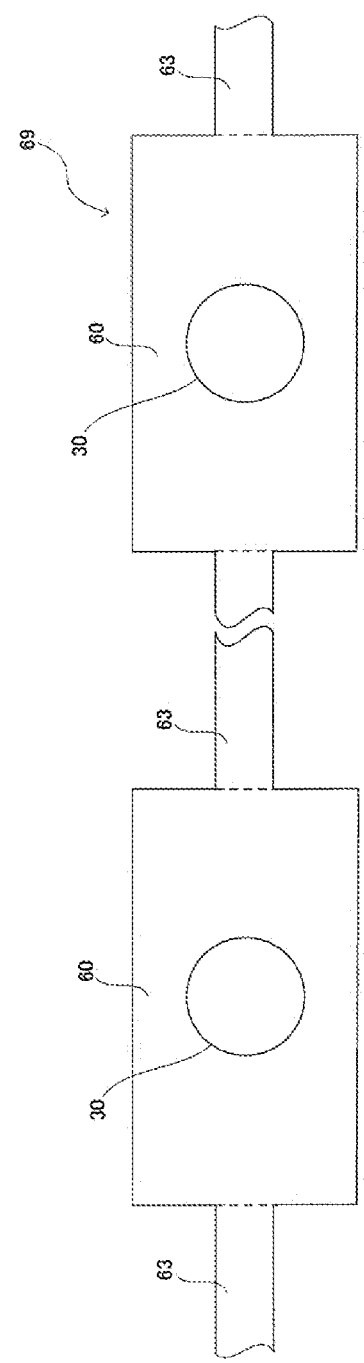
FIG. 15 shows a modification of the wiring substrate according to the first embodiment of the present invention.
Figure 16:
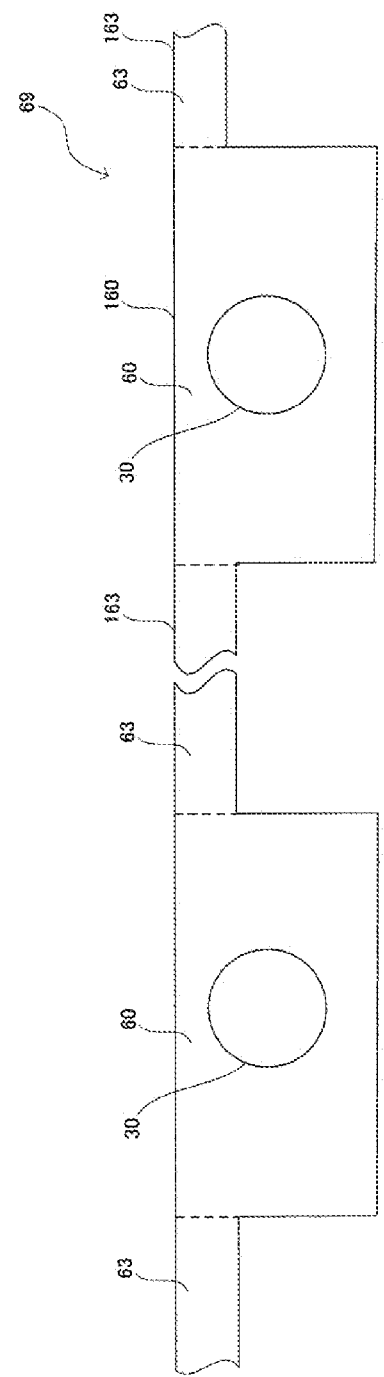
FIG. 16 shows a modification of the wiring substrate according to the first embodiment of the present invention.

With reference to FIG. 15 and FIG. 16, the land portion 60 has a rectangular shape. In FIG. 16, an edge 160 positioned at an end in the substrate width direction of the land portion 60 and its corresponding edge 163 positioned at an end in the substrate width direction of the wire portion 63 form a straight line.

FIG. 17 to FIG. 20 each show a modification of the FPC in the wiring substrate according to the first embodiment of the present invention.

Figure 17:
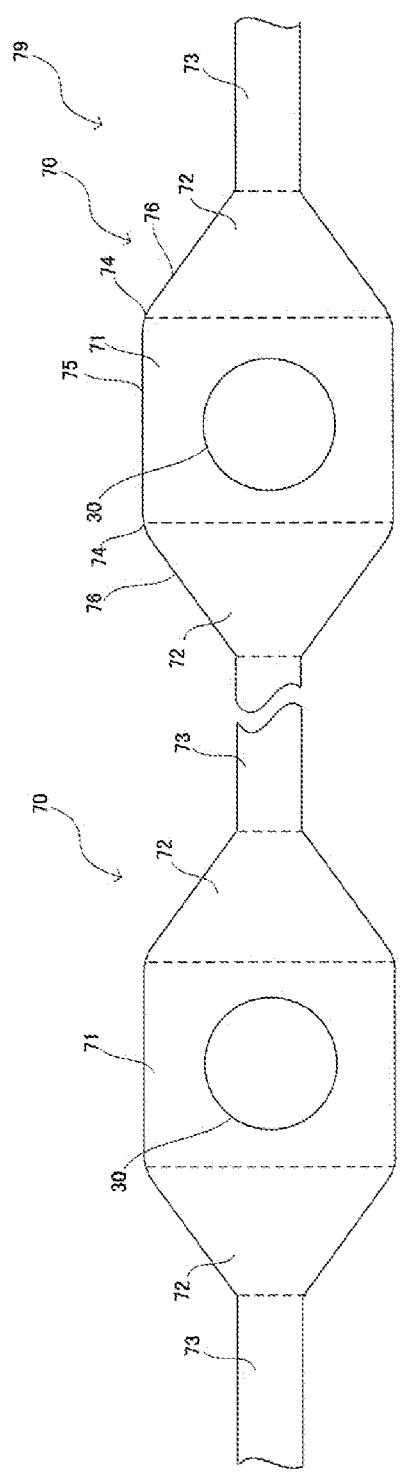
FIG. 17 shows a modification of the FPC in the wiring substrate according to the first embodiment of the present invention.

With reference to FIG. 17, the shape of the FPC land portion 70 is different from the shape of the FPC land portion 70 shown in FIG. 10. Specifically, in the FPC land portion 70, each connection portion 74 between the edge 75 positioned at an end of the inside region 71 and its corresponding edge 76 positioned at an end of the outside region 62 forms a curve. More specifically, the FPC land portion 70 has a rounded hexagonal shape.

It should be noted that the connection portion 74 between the edge 75 and the edge 76 may form a continuous curve, i.e., a smoother curve. Specifically, the edge 65 and the edge 66 may form an arc, for example.

Figure 18:
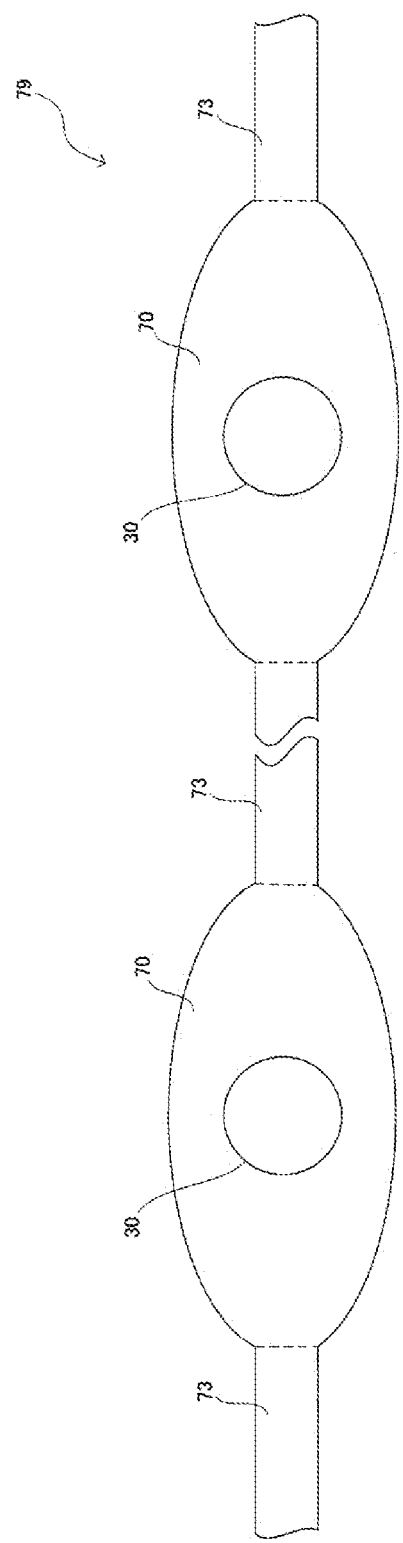
FIG. 18 shows a modification of the FPC in the wiring substrate according to the first embodiment of the present invention.

With reference to FIG. 18, the shape of the FPC land portion 70 is different from the shape of the FPC land portion 70 shown in FIG. 10. Specifically, the FPC land portion 70 has an elliptic shape.

Figure 19:
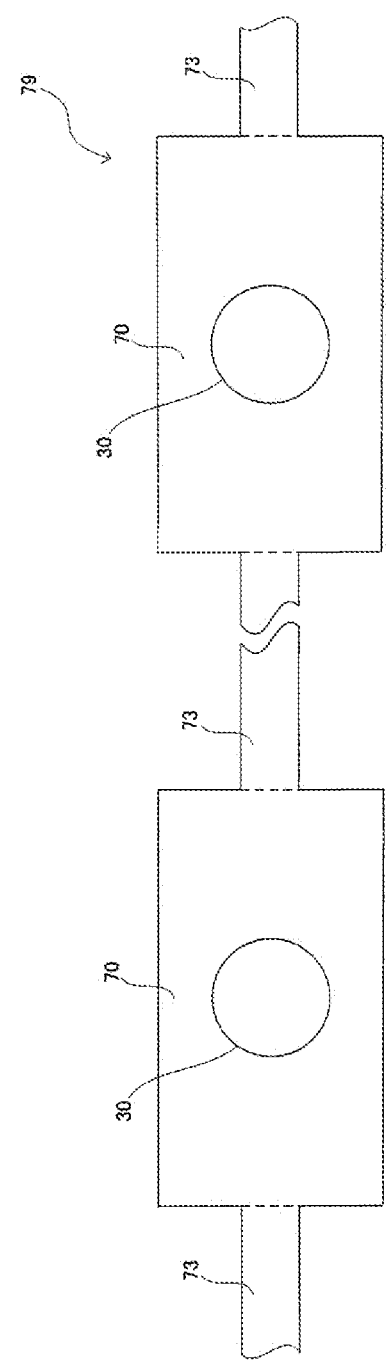
FIG. 19 shows a modification of the FPC in the wiring substrate according to the first embodiment of the present invention.
Figure 20:
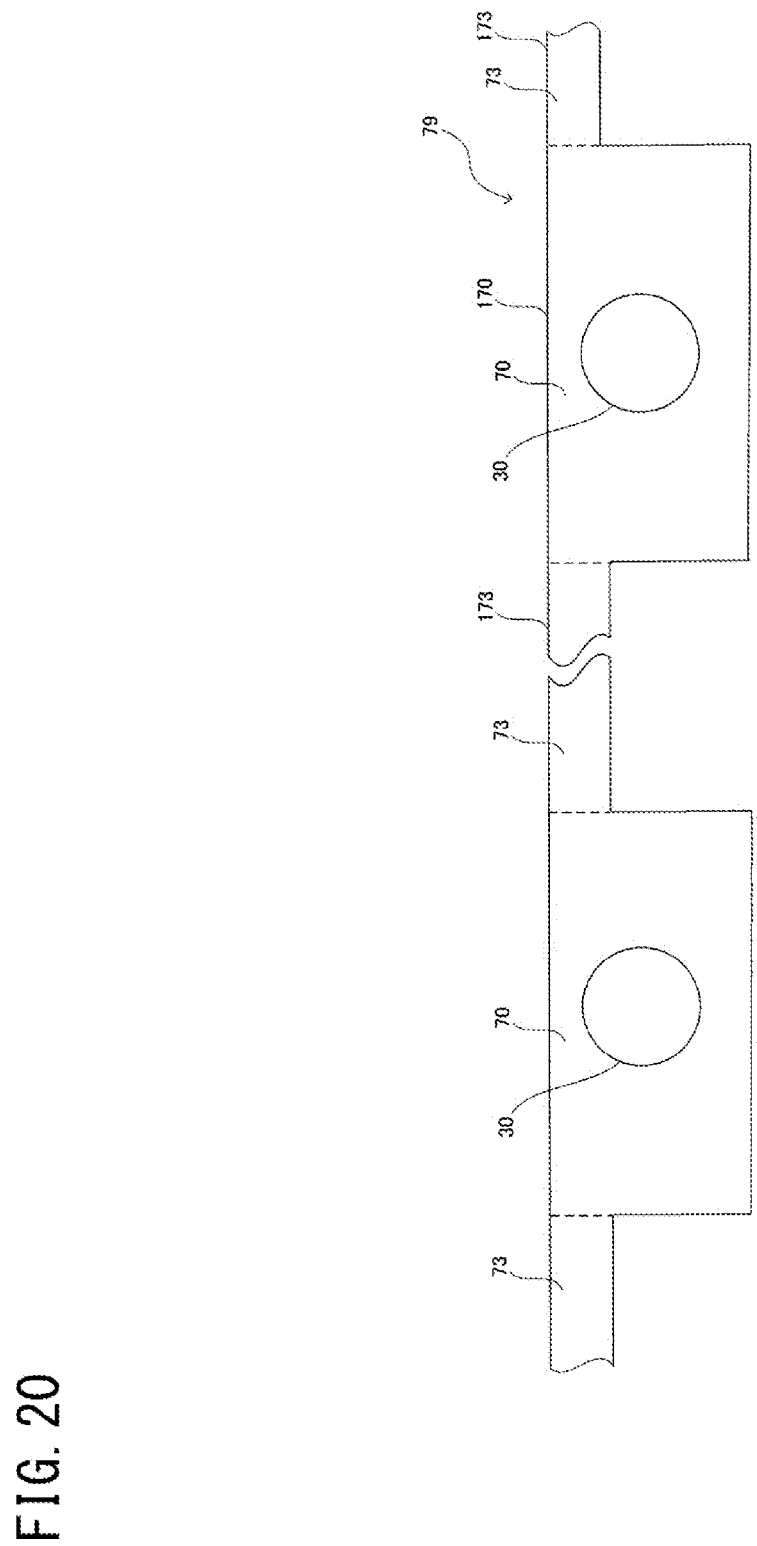
FIG. 20 shows a modification of the FPC in the wiring substrate according to the first embodiment of the present invention.

With reference to FIG. 19 and FIG. 20, the FPC land portion 70 has a rectangular shape. In FIG. 20, an edge 170 positioned at an end in the substrate width direction of the FPC land portion 70 and its corresponding edge 173 positioned at an end in the substrate width direction of the FPC wire portion 73 form a straight line.

It should be noted that, in the wiring substrate 69 according to the first embodiment of the present invention, the FPC 79 and the reinforcement plate 89 are configured to be fixed by the intra-substrate adhesive layer 58, but the configuration is not limited thereto. For example, the FPC 79 and the reinforcement plate 89 may be configured to be fixed by being screwed.

In the wiring module 49 according to the first embodiment of the present invention, the wiring substrate 69 is configured to be fixed to the base portion 38 by the base adhesive layer 59, but the configuration is not limited thereto. For example, the wiring substrate 69 may be configured to be fixed to the base portion 38 by being screwed.

Meanwhile, for example, in the concentrator solar cell module described in PATENT LITERATURE 1, when sunlight is converged onto a solar cell element by a lens, the temperature of the solar cell element becomes high. Heat of the solar cell element is transferred to the receiver substrate to which the solar cell element is mounted, and thus, the receiver substrate expands due to heat in some cases.

For example, in a situation where the receiver substrate is adhered to a surface at which the receiver substrate is placed, if the receiver substrate expands due to heat, the receiver substrate comes to be easily detached from the surface. Then, for example, if the portion of the receiver substrate to which the solar cell element is mounted is detached from the surface, the position of the solar cell element is shifted from the focal point of the lens, thus, causing decrease in the power generating efficiency of the solar cell element in some cases.

In contrast to this, the power generation module according to the first embodiment of the present invention includes the power generating portion 30 and the wiring substrate 69. The power generating portion 30 includes the power generating element 19. The wiring substrate 69 includes the reinforcement plate 89 and the FPC 79 provided above the reinforcement plate 89. The power generating portion 30 is mounted to the FPC land portion 70 in the FPC 79. The FPC wire portion 73 is connected to the FPC land portion 70. The width Wf3 of the FPC wire portion 73 is smaller than the width Wf0 of the FPC land portion 70.

With this configuration, the wiring substrate 69 having a certain degree of flexibility can be further provided with a feature that the FPC wire portion 73 more easily bends than the FPC land portion 70. Accordingly, for example, even in a case where compressive stress in the extending direction is applied to the wiring substrate 69 as a result of thermal expansion of the wiring substrate 69, the FPC wire portion 73 bends so as to absorb the expansion in the extending direction, whereby deformation and positional shift of the FPC land portion 70 can be prevented. Accordingly, for example, in a case where a lens having its focal point set at the power generating portion 30 is provided above the power generating portion 30 mounted to the FPC land portion 70, the position of the power generating portion 30 can be prevented from being shifted from the focal point of the lens.

Therefore, in the power generation module according to the first embodiment of the present invention, decrease in the power generating efficiency due to influence of heat can be suppressed.

In the power generation module according to the first embodiment of the present invention, the FPC land portion 70 has the length Lf1 along the extending direction of the wiring substrate 69. The FPC wire portion 73 has the length Lf3 along the extending direction of the wiring substrate 69. The length Lf3 of the FPC wire portion 73 is greater than the length Lf1 of the FPC land portion 70.

This configuration allows the FPC wire portion 73 to more easily bend than the FPC land portion 70. Thus, the position of the power generating portion 30 can be more reliably prevented from being shifted from the focal point of the lens.

In the power generation module according to the first embodiment of the present invention, the length Lf3 of the FPC wire portion 73 is greater than 100% and not greater than 600% of the length Lf1 of the FPC land portion 70.

With this configuration, it is possible to make the FPC land portion 70 less likely to bend than the FPC wire portion 73, while causing the FPC land portion 70 to have a size that allows the power generating portion 30 to be mounted thereto.

In the power generation module according to the first embodiment of the present invention, the width Wf3 of the FPC wire portion 73 is not less than 0.1% and not greater than 50% of the width Wf0 of the FPC land portion 70.

With this configuration, for example, the width Wf3 of the FPC wire portion 73 can be reduced relative to the width Wf0 of the FPC land portion 70. Thus, it is possible to provide the FPC wire portion 73 with a feature that the FPC wire portion 73 more easily bends than the FPC land portion 70. In addition, the width Wf3 of the FPC wire portion 73 can be increased to an extent that the strength of the FPC wire portion 73 does not pose a problem.

In the power generation module according to the first embodiment of the present invention, the FPC land portion 70 has the inside region 71 and the outside region 72. The inside region 71 has the width Wf1. The outside region 72 is positioned at at least one end in the length direction of the FPC land portion 70, is connected to the inside region 71, and has the width Wf2. The width Wf2 of the outside region 72 is smaller than the width Wf1 of the inside region 71 and is greater than the width Wf3 of the FPC wire portion 73.

With this configuration, for example, heat transferred from the power generating portion 30 to the inside region 71 can be efficiently dissipated via the outside region 72 to the FPC wire portion 73.

In the power generation module according to the first embodiment of the present invention, the outside region 72 is positioned at each of both ends in the length direction of the FPC land portion 70. The width Wf2 of the outside region 72 is smaller than the width Wf1 of the inside region 71 and is greater than the width Wf3 of the FPC wire portion 73.

With this configuration, heat in the inside region 71 can be dissipated to both of the FPC wire portions 73 connected to the respective outside regions 72.

In the power generation module according to the first embodiment of the present invention, the width Wf2 of the outside region 72 becomes smaller from the inside region 71 toward the FPC wire portion 73.

With this configuration, heat in the outside region 72 can be efficiently dissipated to the FPC wire portion 73.

In the power generation module according to the first embodiment of the present invention, the outside region 72 has the length Lf12 along the extending direction of the wiring substrate 69. The relationship between the width Wf2 of the outside region 72 and the length Lf12 of the outside region 72 satisfies the formula below.

$$0 < (Lf12/Wf2) \leq 10$$

With this configuration, heat in the outside region 72 can be more efficiently dissipated to the FPC wire portion 73.

In the power generation module according to the first embodiment of the present invention, in a plan view from above the wiring substrate 69, the power generating portion 30 is disposed such that a center portion of the power generating portion 30 is included in the inside region 71.

With this configuration, the power generating portion 30 can be disposed at a position separated to some extent from the FPC wire portion 73. Thus, positional shift of the power generating portion 30 due to influence of bending of the FPC wire portion 73 can be more reliably prevented.

In the power generation module according to the first embodiment of the present invention, the area Sf1 of the FPC land portion 70 is not less than 20% and not greater than 1000% of the area of the FPC wire portion 73.

With this configuration, it is possible to make the FPC land portion 70 less likely to bend than the FPC wire portion 73, while causing the FPC land portion 70 to have a size that allows the power generating portion 30 to be mounted thereto.

In the power generation module according to the first embodiment of the present invention, the land reinforcement portion 80 in the reinforcement plate 89 is fixed to the FPC land portion 70. The wire reinforcement portion 83 is fixed to the FPC wire portion 73. The width Ws3 of the wire reinforcement portion 83 is smaller than the width Ws0 of the land reinforcement portion 80.

This configuration allows the FPC wire portion 73 to more easily bend than the FPC land portion 70.

In the power generation module according to the first embodiment of the present invention, the reinforcement plate 89 is adhered to the base portion 38 by the base adhesive layer 59. The land adhesion region 50 in the base adhesive layer 59 adheres the land reinforcement portion 80 to the base portion 38. The wire adhesion region 53 adheres the wire reinforcement portion 83 to the base portion 38. The width Wa3 of the wire adhesion region 53 is smaller than the width Wa0 of the land adhesion region 50.

With this configuration, in a state where the wiring substrate 69 is adhered to the base portion 38, the wire reinforcement portion 83 is allowed to be more easily detached from the base portion 38, than the land reinforcement portion 80. Accordingly, for example, even when compressive stress in the extending direction is applied to the wiring substrate 69 as a result of thermal expansion of the wiring substrate 69, the wire reinforcement portion 83 and the FPC wire portion 73 which are in a state of being fixed to each other bend while being detached from the base portion 38 so as to absorb the expansion in the extending direction. Accordingly, deformation and positional shift of the FPC land portion 70 can be prevented.

In the power generation module according to the first embodiment of the present invention, the outside region 72 is positioned at at least one end in the length direction of the FPC land portion 70, is connected to the inside region 71, and has the width Wf2. The width Wf1 of the inside region 71 is greater than the width Wf2 of the outside region 72. Each edge 75 of the inside region 71 is positioned at an end of the inside region 71 in the width direction of the FPC land portion 70. Each edge 76 of the outside region 72 is connected to its corresponding edge 75 of the inside region 71, and is positioned at an end of the outside region 72 in the width direction of the FPC land portion 70. The angle between the edge 75 and the edge 76 is greater than 90 degrees and not greater than 170 degrees.

Thus, with the configuration in which the angle in the FPC land portion 70 is set to be an obtuse angle, for example, in a case where the FPC 79 and the reinforcement plate 89 in the wiring substrate 69 are adhered to each other, it is possible to suppress detachment between the FPC 79 and the reinforcement plate 89 at a corner of the FPC land portion 70 due to influence of dew condensation or the like.

In the wiring substrate according to the first embodiment of the present invention, the land portion 60 has a shape that allows the power generating portion 30 to be mounted to the land portion 60. The width Wb3 of the wire portion 63 is smaller than the width Wb0 of the land portion 60. Each of the land portion 60 and the wire portion 63 includes: the reinforcement plate 89 formed of metal; and a flexible printed circuit provided above the reinforcement plate 89. The land portion 60 has the inside region 61 and the outside region 62. The inside region 61 has the width Wb1. The outside region 62 is positioned at at least one end in the length direction of the land portion 60, is connected to the inside region 61, and has the width Wb2. The width Wb1 of the inside region 61 is greater than the width Wb2 of the outside region 62. Each edge 65 of the inside region 61 is positioned at an end of the inside region 61 in the width direction of the land portion 60. Each edge 66 of the outside region 62 is connected to its corresponding edge of the inside region 61, and is positioned at an end of the outside region 62 in the width direction of the land portion 60. The angle between the edge 65 of the inside region 61 and the edge 66 of the outside region 62 is greater than 90 degrees and not greater than 170 degrees.

Thus, with the configuration in which the angle in the land portion 60 is set to be an obtuse angle, for example, in a case where the flexible printed circuit 79 and the reinforcement plate 89 in the wiring substrate 69 are adhered to each other, it is possible to suppress detachment between the flexible printed circuit 79 and the reinforcement plate 89 at a corner of the land portion 60 due to influence of dew condensation or the like. In addition, in a case where the wiring substrate 69 and the base portion 38 at which the wiring substrate 69 is placed are adhered to each other, it is possible to suppress detachment of the land portion 60 from the base portion 38 due to influence of dew condensation or the like.

Therefore, in the wiring substrate according to the first embodiment of the present invention, it is possible to suppress decrease in the power generating efficiency due to influence of dew condensation or the like.

In a modification of the power generation module according to the first embodiment of the present invention, the connection portion between the edge 75 of the inside region 71 and the edge 76 of the outside region 72 forms a curve.

Thus, with the configuration in which roundness is provided to the FPC land portion 70 to reduce corners, it is possible to more reliably prevent detachment between the FPC 79 and the reinforcement plate 89 due to influence of dew condensation or the like.

In a modification of the power generation module according to the first embodiment of the present invention, the connection portion between the edge 75 of the inside region 71 and the edge 76 of the outside region 72 forms a continuous curve.

This configuration can make smoother the periphery of the FPC land portion 70. Thus, it is possible to more reliably prevent detachment between the FPC 79 and the reinforcement plate 89 due to influence of dew condensation or the like.

In a modification of the wiring substrate according to the first embodiment of the present invention, the connection portion between the edge 65 of the inside region 61 and the edge 66 of the outside region 62 is a curve.

Thus, with the configuration in which roundness is provided to the land portion 60 to reduce corners, for example, in a case where the flexible printed circuit 79 and the reinforcement plate 89 are adhered to each other in the wiring substrate 69, it is possible to suppress detachment between the flexible printed circuit 79 and the reinforcement plate 89 due to influence of dew condensation or the like. In addition, in a case where the wiring substrate 69 and the base portion 38 at which the wiring substrate 69 is placed are adhered to each other, it is possible to suppress detachment of the land portion 60 from the base portion 38 due to influence of dew condensation or the like.

Therefore, in a modification of the wiring substrate according to the first embodiment of the present invention, it is possible to suppress decrease in the power generating efficiency due to influence of dew condensation or the like.

In a modification of the wiring substrate according to the first embodiment of the present invention, the connection portion between the edge 65 of the inside region 61 and the edge 66 of the outside region 62 forms a continuous curve.

This configuration can make further smoother the periphery of the land portion 60. Thus, it is possible to more reliably prevent detachment between the flexible printed circuit 79 and the reinforcement plate 89 due to influence of dew condensation or the like. In addition, it is possible to more reliably prevent detachment of the land portion 60 from the base portion due to influence of dew condensation or the like.

Next, another embodiment of the present invention will be described with reference to the drawings. It should be noted that the same or corresponding parts are denoted by the same reference signs, and description thereof is not repeated.

Second Embodiment

The present embodiment relates to a wiring substrate that does not include the FPC, compared with the wiring substrate according to the first embodiment. Except the contents described below, this photovoltaic apparatus is the same as that according to the first embodiment.

In the present embodiment, the photovoltaic module 10 includes a wiring substrate 269 instead of the wiring substrate 69 in the photovoltaic module 10 according to the first embodiment. Specifically, the wiring substrate 269 includes another kind of substrate instead of the FPC 79, and does not include the reinforcement plate 89. The wiring substrate 269 is the same as the wiring substrate 69, except the contents described below.

Figure 21:
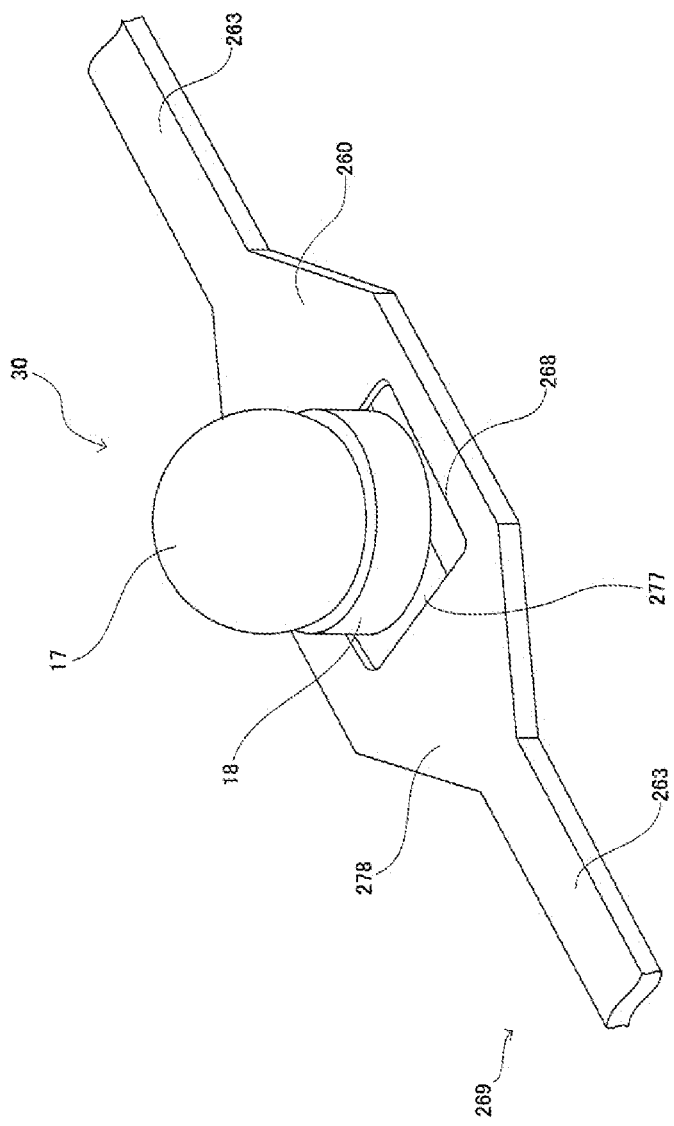
FIG. 21 is a perspective view showing a state of the power generating portion mounted to the wiring substrate according to a second embodiment of the present invention.

FIG. 21 is a perspective view showing a state of the power generating portion mounted to the wiring substrate according to the second embodiment of the present invention.

With reference to FIG. 21, the wiring substrate 269 includes: a conductive portion 277; and an insulating portion 278 which covers the conductive portion 277. The power generating portion 30 is mounted to a land portion 260 of the wiring substrate 269. Specifically, an opening 268 is provided to the land portion 260. In the opening 268, the insulating portion 278 does not cover the upper side of the conductive portion 277, and thus, the conductive portion 277 is exposed. The power generating portion 30 is electrically connected to the conductive portion 277 in the opening 268.

The conductive portion 277 connects, in series, the power generating portion 30 mounted in the land portion 260 and the power generating portion 30 mounted in another land portion 260 adjacent to the land portion 260, for example.

Figure 22:
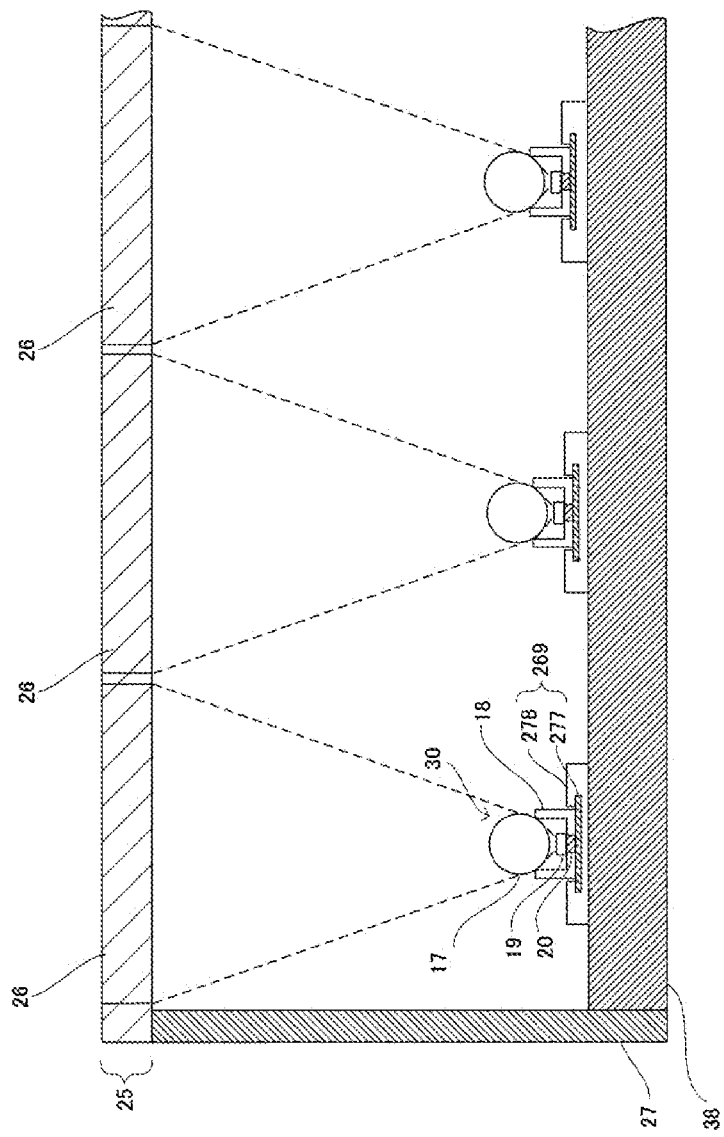
FIG. 22 is a cross-sectional view showing a cross section, along a line that corresponds to the VI-VI line in FIG. 4, of the photovoltaic module according to the second embodiment of the present invention.

FIG. 22 is a cross-sectional view showing a cross section, along a line that corresponds to the VI-VI line in FIG. 4, of the photovoltaic module according to the second embodiment of the present invention.

With reference to FIG. 22, the wiring substrate 269 is placed at the upper main surface of the base portion 38. The power generating element 19 is housed in the package 18. The power generating element 19 is mounted to the wiring substrate 269 in a state of being housed in the package 18. Specifically, the electrode not shown of the power generating element 19 is connected to the conductive portion 277 of the wiring substrate 269, via the package electrode 20 provided so as to penetrate the bottom of the package 18.

Figure 23:
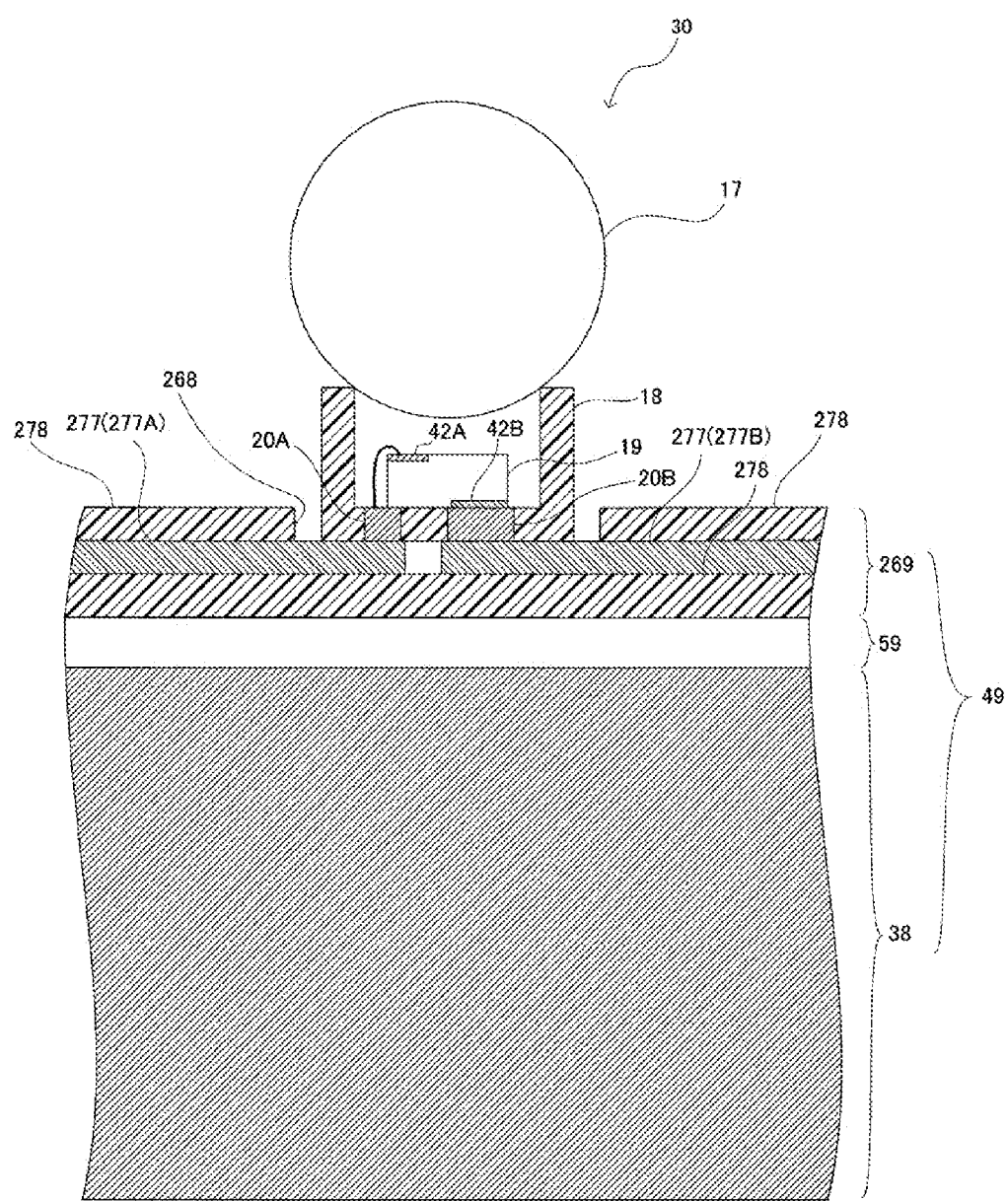
FIG. 23 is a cross-sectional view showing a cross section, along a line that corresponds to the VII-VII line in FIG. 4, of the wiring module and the power generating portion in the photovoltaic module according to the second embodiment of the present invention.

FIG. 23 is a cross-sectional view showing a cross section, along a line that corresponds to the VII-VII line in FIG. 4, of the wiring module and the power generating portion in the photovoltaic module according to the second embodiment of the present invention.

FIG. 23 also shows an adhesive layer not shown in FIG. 22, for example. Specifically, with reference to FIG. 23, the power generating portion 30 is mounted to the wiring module 49, specifically, the wiring substrate 269 of the wiring module 49. The wiring substrate 269 and the base portion 38 are adhered together by the base adhesive layer 59.

In the opening 268 in the wiring substrate 269, the insulating portion 278 does not cover the upper side of the conductive portion 277, and thus, a part of the conductive portion 277, specifically, a part of a conductive portion 277A and a part of a conductive portion 277B, is exposed.

The package electrode 20A and the package electrode 20B are connected by, for example, soldering to the conductive portion 277A and the conductive portion 277B, respectively.

The package 18 supports the ball lens 17 at the edge of the side wall of the package 18, and fixes the focal point of the ball lens 17 to the power generating element 19.

Figure 24:
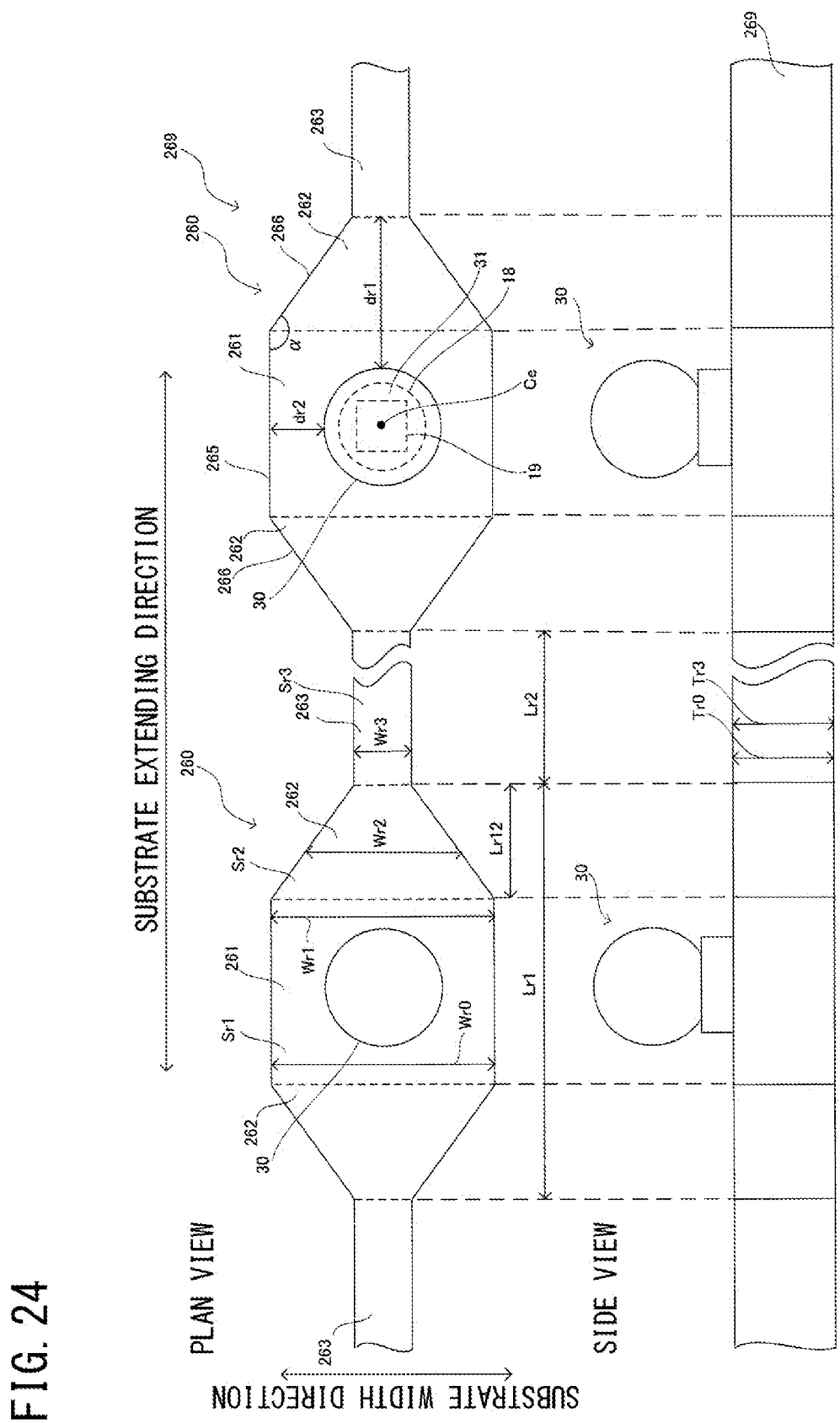
FIG. 24 shows the wiring substrate according to the second embodiment of the present invention.

FIG. 24 shows the wiring substrate according to the second embodiment of the present invention.

FIG. 24 shows a plan view and a side view of a part of the wiring substrate 269. With reference to FIG. 24, the wiring substrate 269 includes a plurality of land portions 260 and a plurality of wire portions 263.

The power generating portion 30 including the power generating element 19 is mounted to the land portion 260. The wire portion 263 is electrically connected to the power generating element 19. The wire portion 263 electrically connects the land portions 260 that are adjacent to each other, i.e., the power generating portions 30 that are adjacent to each other.

A length Lr2 of the wire portion 263 in the extending direction of the wiring substrate 269 is greater than a length Lr1 of the land portion 260 in the extending direction. Hereinafter, the extending direction of the wiring substrate 269 will also be referred to as a substrate extending direction.

A width Wr3 of the wire portion 263 is smaller than a width Wr0 of the land portion 260. The width Wr0 of the land portion 260 and the width Wr3 of the wire portion 263 respectively are the length of the land portion 260 and the length of the wire portion 263, in a direction that crosses the substrate extending direction, specifically, in a direction perpendicular to the substrate extending direction, for example. Hereinafter, the direction that crosses the substrate extending direction, i.e., the width direction of the land portion 260, will also be referred to as a substrate width direction.

The width Wr0 of the land portion 260 is not less than 200% and not greater than 1000% of the width Wr3 of the wire portion 263, for example.

The length Lr1 in the substrate extending direction of the land portion 260 is greater than the width Wr0 of the land portion 260.

For example, the land portion 260 has an inside region 261 and two outside regions 262. The outside regions 262 are respectively connected to both ends in the substrate extending direction of the inside region 261. Specifically, each outside region 262 is connected between an end in the substrate extending direction of the inside region 261 and a wire portion 263.

The number of the outside regions 262 of the land portion 260 may be one. In this case, the outside region 262 is connected to either one of the ends in the substrate extending direction of the inside region 261, for example.

The inside region 261 has a width Wr1 that corresponds to the width Wr0. The outside region 262 has a width Wr2. The width Wr1 of the inside region 261 and the width Wr2 of the outside region 262 are the length of the inside region 261 and the length of the outside region 262 in the substrate width direction, respectively.

For example, the width Wr2 of the outside region 262 is smaller than the width Wr1 of the inside region 261. In addition, for example, the width Wr2 of the outside region 262 is greater than the width Wr3 of the wire portion 263.

For example, the width Wr2 of outside region 262 continuously becomes smaller toward its corresponding wire portion 263 to which the outside region 262 is connected.

For example, the relationship between the width Wr2 of the outside region 262 and the length Lr12 in the substrate extending direction of the outside region 262 is expressed by the formula (4) below.

$$0 < Lr12/Wr2 \leq 10 \tag{4}$$

For example, an area Sr1 of the inside region 261 is greater than an area Sr2 of the outside region 262. Specifically, for example, the area Sr1 of the inside region 261 is not less than 200% and not greater than 1000% of the area Sr2 of the outside region 262.

For example, in a plan view from above the wiring substrate 269, specifically, in a plan view in a direction from above the wiring substrate 269 toward the mounting surface for the power generating portion 30, the power generating portion 30 is disposed such that a center portion of the power generating portion 30, specifically, the center Ce of the power generating portion 30, is included in the inside region 261.

For example, in a plan view from above the wiring substrate 269, a distance dr1 from the power generating portion 30 to the wire portion 263 in the substrate extending direction is greater than a distance dr2 from the power generating portion 30 to an end of the land portion 260 in the substrate width direction.

For example, the wiring substrate 269 has an electrode for soldering the power generating portion 30. Specifically, for example, the electrode is the exposed portion of the conductive portion 277 in the opening 268, and is provided so as to be included in the inside region 261.

For example, not less than 80% of the mounting region 31 is included in the inside region 261, the mounting region 31 being the region where the power generating portion 30 is mounted in the land portion 260. In the example shown in FIG. 24, 100% of the mounting region 31 is included in the inside region 261.

For example, a thickness Tr3 of the wire portion 263 is not less than 1% and not greater than 50% of the width Wr3 of the wire portion 263.

The inside region 261 has edges 265. Each edge 265 is positioned at an end of the inside region 261 in the substrate width direction. The outside region 262 has edges 266. Each edge 266 is positioned at an end of the outside region 262 in the substrate width direction.

The edge 265 and the edge 266 are connected to each other. An angle α between the edge 265 and the edge 266 is greater than 90 degrees and not greater than 170 degrees, for example.

The other configurations and operation are the same as those of the photovoltaic apparatus according to the first embodiment, and thus, detailed description thereof is not repeated here.

The above embodiments are merely illustrated in all aspects and should not be recognized as being restrictive. The scope of the present invention is defined by the scope of the claims rather than by the description above, and is intended to include meaning equivalent to the scope of the claims and all modifications within the scope.

The above description includes the features in the additional notes below.

[Additional Note 1]
A power generation module including:
a power generating portion including a power generating element; and
a wiring substrate, wherein
the wiring substrate includes:
a reinforcement plate; and
a flexible printed circuit provided above the reinforcement plate,
the flexible printed circuit has:
a land portion configured to have the power generating portion mounted thereto; and
a wire portion whose length in an extending direction of the wiring substrate is greater than a length in the extending direction of the land portion,
a width of the wire portion is smaller than a width of the land portion,
the power generation module is used in a photovoltaic apparatus, and
in the photovoltaic apparatus, sunlight converged by a lens is applied to the power generating portion.

[Additional Note 2]
A wiring substrate including:
a land portion configured to have a power generating portion mounted thereto, the power generating portion including a power generating element; and
a wire portion, wherein
a width of the wire portion is smaller than a width of the land portion,
each of the land portion and the wire portion includes:
a reinforcement plate formed of metal; and
a flexible printed circuit provided above the reinforcement plate,
the land portion has:
a first region; and
a second region connected to an end of the first region in an extending direction of the wiring substrate,
an angle between an edge of the first region and an edge of the second region is greater than 90 degrees and not greater than 170 degrees, the edge of the first region being positioned at an end of the first region in a width direction of the land portion, the edge of the second region being positioned at an end of the second region in the width direction, the edge of the second region being connected to the edge of the first region,
the wiring substrate is used in a photovoltaic apparatus, and
in the photovoltaic apparatus, sunlight converged by a lens is applied to the power generating portion.

[Additional Note 3]
A wiring substrate including:
a land portion configured to have a power generating portion mounted thereto, the power generating portion including a power generating element; and
a wire portion, wherein
a width of the wire portion is smaller than a width of the land portion,
each of the land portion and the wire portion includes:
a reinforcement plate formed of metal; and
a flexible printed circuit provided above the reinforcement plate,
the land portion has:
a first region; and
a second region connected to an end of the first region in an extending direction of the wiring substrate,
a connection portion between an edge of the first region and an edge of the second region is a curve, the edge of the first region being positioned at an end of the first region in a width direction of the land portion, the edge of the second region being positioned at an end of the second region in the width direction, the edge of the second region being connected to the edge of the first region,
the wiring substrate is used in a photovoltaic apparatus, and
in the photovoltaic apparatus, sunlight converged by a lens is applied to the power generating portion.

REFERENCE SIGNS LIST 10 photovoltaic module
12 photovoltaic panel
13 sun direction sensor
14 frame part
17 ball lens
18 package
19 power generating element
20, 20A, 20B package electrode
25 concentrating portion
26 Fresnel lens
27 wall portion
29 power generation module
30, 30P1, 30P2, 30Q1, 30Q2, 30R1, 30R2 power generating portion
31 mounting region
32, 32A, 32B, 32C, 32D, 32E, 32F, 32G, 32H, 32I, 32J strip-shaped substrate
33, 33H, 33I, 33J, 33K, 33L, 33M, 33N, 33O, 33P coupling portion
38 base portion
39 lead wire
40 pedestal
42A, 42B element electrode
46 base
48 post
49 wiring module
50 land adhesion region
51, 61, 71, 261 inside region
52, 62, 72, 262 outside region
53 wire adhesion region
58 intra-substrate adhesive layer
59 base adhesive layer
60, 260 land portion
63, 263 wire portion
64, 74 connection portion
65, 66, 75, 76, 160, 163, 170, 173, 265, 266 edge
68, 268 opening
69, 269 wiring substrate
70 FPC land portion
73 FPC wire portion
77, 77A, 77B, 277, 277A, 277B conductive portion
78, 278 insulating portion
79 FPC
80 land reinforcement portion
83 wire reinforcement portion
89 reinforcement plate
90 function part
101 photovoltaic apparatus
Cc, Ce center
FL light receiving surface

The invention claimed is:

1. A power generation module comprising:
a power generating portion including a power generating element; and
a wiring substrate, wherein
the wiring substrate includes:
a reinforcement plate; and
a flexible printed circuit (FPC) provided above the reinforcement plate,
the flexible printed circuit comprises:
a conductive portion for electrical connection with the power generating portion;
an insulating portion which covers the conductive portion and is provided between the conductive portion and the reinforcement plate, and determines an outer shape of the flexible printed circuit;
an FPC land portion configured to have the power generating portion mounted thereto; and
an FPC wire portion connected to the FPC land portion,
wherein a width of the insulating portion in the FPC land portion along a direction perpendicular to an extending direction of the wiring substrate is equal to a width of the FPC in the FPC land portion along the direction perpendicular to the extending direction of the wiring substrate,
a width of the insulating portion in the FPC wire portion along the direction perpendicular to the extending direction of the wiring substrate is equal to a width of the FPC in the FPC wire portion along the direction perpendicular to the extending direction of the wiring substrate, and
the width of the FPC in the FPC wire portion along the direction perpendicular to the extending direction of the wiring substrate is smaller than the width of the FPC in the FPC land portion along the direction perpendicular to the extending direction of the wiring substrate.

2. The power generation module according to claim 1, wherein
the FPC land portion has a length along the extending direction of the wiring substrate,
the FPC wire portion has a length along the extending direction of the wiring substrate, and
the length of the FPC wire portion is greater than the length of the FPC land portion.

3. The power generation module according to claim 2, wherein
the length of the FPC wire portion is greater than 100% and not greater than 600% of the length of the FPC land portion.

4. The power generation module according to claim 1, wherein
the width of the FPC wire portion is not less than 0.1% and not greater than 50% of the width of the FPC land portion.

5. The power generation module according to claim 1, wherein
the FPC land portion has a first region and a second region,
the first region has a first width,
the second region is positioned at at least one end of the FPC land portion, the second region being connected to the first region, the second region having a second width, and
the second width is smaller than the first width and is greater than the width of the FPC wire portion.

6. The power generation module according to claim 1, wherein
the FPC land portion has a first region and a second region,
the first region has a first width,
the second region is positioned at each of both ends of the FPC land portion, the second region being connected to the first region, the second region having a second width, and the second width is smaller than the first width and is greater than the width of the FPC wire portion.

7. The power generation module according to claim 5, wherein
the second width becomes smaller from the first region toward the FPC wire portion.

8. The power generation module according to claim 5, wherein
the second region has a length along the extending direction of the wiring substrate, and
relationship between the second width and the length of the second region satisfies a formula below, $$0 < (Lf12/Wf2) \leq 10$$

where Wf2 is the second width and Lf12 is the length of the second region.

9. The power generation module according to claim 5, wherein
in a plan view from above the wiring substrate, the power generating portion is disposed such that a center portion of the power generating portion is included in the first region.

10. The power generation module according to claim 1, wherein
an area of the FPC land portion is not less than 20% and not greater than 1000% of an area of the FPC wire portion.

11. The power generation module according to claim 1, wherein
the reinforcement plate has:
a land reinforcement portion fixed to the FPC land portion; and
a wire reinforcement portion fixed to the FPC wire portion, and
a width of the wire reinforcement portion is smaller than a width of the land reinforcement portion.

12. The power generation module according to claim 11, wherein
the reinforcement plate is adhered to a base portion by an adhesive layer,
the adhesive layer has:
a land adhesion region configured to adhere the land reinforcement portion to the base portion; and
a wire adhesion region configured to adhere the wire reinforcement portion to the base portion, and
a width of the wire adhesion region is smaller than a width of the land adhesion region.

13. The power generation module according to claim 1, wherein
the FPC land portion has a first region and a second region,
the first region has a first width,
the second region is positioned at at least one end in a length direction of the FPC land portion, the second region being connected to the first region, the second region having a second width,
the first width is greater than the second width, and
an angle between an edge of the first region and an edge of the second region is greater than 90 degrees and not greater than 170 degrees, the edge of the first region being positioned at an end of the first region in a width direction of the FPC land portion, the edge of the second region being positioned at an end of the second region in the width direction, the edge of the second region being connected to the edge of the first region.

14. The power generation module according to claim 1, wherein
the FPC land portion has a first region and a second region,
the first region has a first width,
the second region is positioned at at least one end in a length direction of the FPC land portion, the second region being connected to the first region, the second region having a second width,
the first width is greater than the second width, and
a connection portion between an edge of the first region and an edge of the second region forms a curve, the edge of the first region being positioned at an end of the first region in a width direction of the FPC land portion, the edge of the second region being positioned at an end of the second region in the width direction, the edge of the second region being connected to the edge of the first region.

15. The power generation module according to claim 14, wherein
the connection portion between the edge of the first region and the edge of the second region forms a continuous curve.

16. A wiring substrate, the wiring substrate configured to have a power generating portion mounted thereto,
the wiring substrate comprising a land portion and a wire portion, wherein
the land portion has a shape that allows the power generating portion to be mounted to the land portion,
a width of the wire portion is smaller than a width of the land portion,
each of the land portion and the wire portion includes:
a reinforcement plate formed of metal; and
a flexible printed circuit provided above the reinforcement plate,
the flexible printed circuit comprises:
a conductive portion for electrical connection with the power generating portion; and
an insulating portion which covers the conductive portion and is provided between the conductive portion and the reinforcement plate, and determines an outer shape of the flexible printed circuit;
wherein a width of the insulating portion in the land portion along a direction perpendicular to an extending direction of the wiring substrate equals to a width of the flexible printed circuit in the land portion along the direction perpendicular to the extending direction of the wiring substrate,
a width of the insulating portion in the wire portion along the direction perpendicular to the extending direction of the wiring substrate equals to a width of the flexible printed circuit in the wire portion along the direction perpendicular to the extending direction of the wiring substrate,
the width of the flexible printed circuit in the wire portion along the direction perpendicular to the extending direction of the wiring substrate is smaller than the width of the flexible printed circuit in the land portion along the direction perpendicular to the extending direction of the wiring substrate, and
the land portion has a first region and a second region,
the first region has a first width,
the second region is positioned at at least one end in a length direction of the land portion, the second region being connected to the first region, the second region having a second width,
the first width is greater than the second width, and
an angle between an edge of the first region and an edge of the second region is greater than 90 degrees and not greater than 170 degrees, the edge of the first region being positioned at an end of the first region in a width direction of the land portion, the edge of the second region being positioned at an end of the second region in the width direction, the edge of the second region being connected to the edge of the first region.

* * * * *